US011575083B2

(12) United States Patent
Gosavi et al.

(10) Patent No.: US 11,575,083 B2
(45) Date of Patent: Feb. 7, 2023

(54) INSERTION LAYER BETWEEN SPIN HALL EFFECT OR SPIN ORBIT TORQUE ELECTRODE AND FREE MAGNET FOR IMPROVED MAGNETIC MEMORY

(71) Applicant: Intel Corporation, Santa Clara, CA (US)

(72) Inventors: Tanay Gosavi, Hillsboro, OR (US); Sasikanth Manipatruni, Portland, OR (US); Kaan Oguz, Portland, OR (US); Ian Young, Portland, OR (US); Dmitri Nikonov, Beaverton, OR (US); Chia-Ching Lin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 15/943,461

(22) Filed: Apr. 2, 2018

(65) Prior Publication Data
US 2019/0305212 A1    Oct. 3, 2019

(51) Int. Cl.
  *H01L 43/04*    (2006.01)
  *H01L 43/06*    (2006.01)
  (Continued)

(52) U.S. Cl.
  CPC ............ *H01L 43/04* (2013.01); *G11C 11/161* (2013.01); *G11C 11/1675* (2013.01);
  (Continued)

(58) Field of Classification Search
  CPC ......... H01L 43/04; H01L 43/06; H01L 43/10; H01L 43/14; H01L 27/228; H01L 43/08;
  (Continued)

(56) References Cited

U.S. PATENT DOCUMENTS 8,482,970 B2    7/2013    Dimitrov
9,324,402 B2    4/2016    Wu et al.
(Continued)

FOREIGN PATENT DOCUMENTS

WO    2016048248    3/2016
WO    2017044109    3/2017
(Continued)

OTHER PUBLICATIONS

Zelezny et al. "Spin transport and spin torque in antiferromagnetic devices" in Nature Physics vol. 14, pp. 220-228. Published by Nature Research. (Year: 2018).*

(Continued)

*Primary Examiner* — Tuan A Hoang
(74) *Attorney, Agent, or Firm* — Essential Patents Group, LLP

(57) ABSTRACT

An apparatus is provided which comprises: a magnetic junction having a magnet with a first magnetization (e.g., perpendicular magnetization); a first structure adjacent to the magnetic junction, wherein the first structure comprises metal (e.g., Hf, Ta, W, Ir, Pt, Bi, Cu, Mo, Gf, Ge, Ga, or Au); an interconnect adjacent to the first structure; and a second structure adjacent to the interconnect such that the first structure and the second structure are on opposite surfaces of the interconnect, wherein the second structure comprises a magnet with a second magnetization (e.g., in-plane magnetization) substantially different from the first magnetization.

19 Claims, 24 Drawing Sheets

(51) Int. Cl.
*H01L 43/10* (2006.01)
*G11C 11/16* (2006.01)
*H01L 43/14* (2006.01)
*B82Y 25/00* (2011.01)

(52) U.S. Cl.
CPC .............. *H01L 43/06* (2013.01); *H01L 43/10* (2013.01); *H01L 43/14* (2013.01); *B82Y 25/00* (2013.01)

(58) Field of Classification Search
CPC .............. G11C 11/161; G11C 11/1675; G11C 11/18; G11C 11/155; G11C 11/1659; G11C 11/16; B82Y 25/00
See application file for complete search history.

(56) References Cited

U.S. PATENT DOCUMENTS

| | | | |
|---|---|---|---|
| 10,340,445 B2 * | 7/2019 | Oguz | H01L 43/10 |
| 10,916,284 B2 * | 2/2021 | Le | G11C 11/1675 |
| 2004/0125673 A1 * | 7/2004 | Daughton | G11C 11/15 365/200 |
| 2005/0285168 A1 | 12/2005 | Worledge et al. | |
| 2010/0090300 A1 | 4/2010 | Xi et al. | |
| 2010/0172173 A1 | 7/2010 | Abu-Rahma et al. | |
| 2012/0250398 A1 | 10/2012 | Morise et al. | |
| 2013/0062715 A1 * | 3/2013 | Chen | G11C 11/161 257/E29.323 |
| 2014/0056060 A1 | 2/2014 | Khvalkovskiy et al. | |
| 2014/0175574 A1 | 6/2014 | Watts et al. | |
| 2014/0269036 A1 | 9/2014 | Pi et al. | |
| 2014/0312441 A1 | 10/2014 | Guo | |
| 2015/0001655 A1 | 1/2015 | Sun et al. | |
| 2015/0008547 A1 * | 1/2015 | Pi | H01L 43/02 257/421 |
| 2015/0041934 A1 * | 2/2015 | Khvalkovskiy | H01L 27/224 257/421 |
| 2015/0171316 A1 | 6/2015 | Park et al. | |
| 2015/0213866 A1 | 7/2015 | Wu et al. | |
| 2016/0042778 A1 | 2/2016 | Manipatruni et al. | |
| 2016/0043301 A1 | 2/2016 | Butler et al. | |
| 2016/0300612 A1 | 10/2016 | Manipatruni et al. | |
| 2016/0380188 A1 | 12/2016 | Hu | |
| 2017/0069827 A1 * | 3/2017 | Lee | H01L 27/222 |
| 2017/0076769 A1 | 3/2017 | Shirotori et al. | |
| 2017/0092848 A1 * | 3/2017 | Jang | H01L 43/08 |
| 2017/0125078 A1 | 5/2017 | Mihajlovic et al. | |
| 2017/0178705 A1 * | 6/2017 | Buhrman | G11C 11/18 |
| 2017/0222135 A1 | 8/2017 | Fukami et al. | |
| 2018/0114898 A1 * | 4/2018 | Lee | H01L 43/06 |
| 2018/0308536 A1 | 10/2018 | Buhrman et al. | |
| 2019/0123098 A1 | 4/2019 | Sun et al. | |
| 2019/0267540 A1 | 8/2019 | Shiokawa | |
| 2019/0304522 A1 | 10/2019 | Tahmasebi et al. | |
| 2019/0304525 A1 * | 10/2019 | Manipatruni | H01L 43/08 |
| 2019/0305216 A1 * | 10/2019 | Gosavi | H01L 43/02 |
| 2019/0386205 A1 * | 12/2019 | Gosavi | H01L 43/04 |
| 2020/0013444 A1 | 1/2020 | Min et al. | |
| 2020/0083286 A1 * | 3/2020 | Manipatruni | G11C 11/161 |
| 2020/0083427 A1 * | 3/2020 | Manipatruni | H01F 10/324 |
| 2020/0098410 A1 * | 3/2020 | Gosavi | H01L 43/12 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |
| 2020/0321472 A1 | 10/2020 | Ramamoorthy et al. | |
| 2020/0321473 A1 | 10/2020 | Ramamoorthy et al. | |
| 2020/0321474 A1 | 10/2020 | Ramamoorthy et al. | |
| 2021/0202507 A1 | 7/2021 | Thareja et al. | |
| 2021/0202510 A1 | 7/2021 | Thareja et al. | |
| 2021/0202689 A1 | 7/2021 | Thareja et al. | |
| 2021/0202690 A1 | 7/2021 | Thareja et al. | |
| 2021/0203324 A1 | 7/2021 | Manipatruni et al. | |
| 2021/0203325 A1 | 7/2021 | Manipatruni et al. | |
| 2021/0203326 A1 | 7/2021 | Manipatruni et al. | |
| 2021/0226636 A1 | 7/2021 | Manipatruni et al. | |

FOREIGN PATENT DOCUMENTS

| | | | |
|---|---|---|---|
| WO | 2017052631 | 3/2017 | |
| WO | 2017052635 | 3/2017 | |
| WO | WO-2017052606 A1 * | 3/2017 | ........... G11C 11/161 |
| WO | 2017105396 | 6/2017 | |
| WO | 2019005147 | 1/2019 | |
| WO | 2019005158 | 1/2019 | |
| WO | 2019125381 | 6/2019 | |
| WO | 2019125383 | 6/2019 | |

OTHER PUBLICATIONS

Nambu et al. "Two-dimensional magnetism and spin-size effect in the S=1 triangular antiferromagnet NiGa2S4" in Journal of Physics: Condensed Matters vol. 23 p. 164202. Published by IOP Publishing. (Year: 2011).*

Dongwon, L., et al., "Study on Exchange-Biased Perpendicular Magnetic Tunnel Junction Based on Pd/Co Multi layers", IEEE Transactions On Magnetics, IEEE Service Center, New York, NY, US. vol. 45, No. 6, Jun. 1, 2009 (Jun. 1, 2009). pp. 2407-2409, XP011258109, ISSN: 0018-9464, DOI: 10.1109/TMAG.2009. 2018590.

Fecioru-Morariu, M., et al., "Effects of Cu Dilution in IrMn on the Exchange Bias of CoFe/IrMn Bilayers", Physical Review Letters, vol. 99, No. 9, Aug. 1, 2007 (Aug. 1, 2007), XP055614810, US. ISSN: 0031-9007, DOI: 10.1103/PhysRevLett.99.097206.

Han, Guchang, et al., "Control of offset field and pinning stability in perpendicular magnetic tunneling junctions with synthetic antiferromagnetic coupling multilayer", Journal of Applied Physics 117, 17B515, 2015, 5 pgs.

Keller, J., et al., "Domain Stte Model for Exchange Bias II. Experiment", Physical Review, B. Condensed Matter, American Institute of Physics. New York, US, vol. 66, No. 1, Jul. 1, 2002 (Jul. 1, 2002), p. 14431-01, XP001125751, ISSN 0163-1829, DOI: 10.1103/PHYSREVB.66.014431.

Misra, A., "Control of exchange bias by diluting the antiferromagnetic layer", Journal of Applied Physics, American Institute of Physics, US, vol. 93, No. 10, May 15, 2003 (May 15, 2003), pp. 6593-6595, XP012057898, ISSN: 0021-8979, DOI: 10.1063/1. 1543880.

Wang, M., et al., "Tunnel Junction with Perpendicular Magnetic Anisotropy: Status and Challenges", Micromachines, vol. 6, No. 8, Aug. 10, 2015 (Aug. 10, 2015), pp. 1023-1045, XP055614473, CH, ISSN: 2072-666X, DOI: 10.3390/mi6081023.

Zelezny, J., et al., "Spin transport and spin torque in antiferromagnetic devices", Nature Physics, Nature Publishing Group, London, GB, vol. 14, No. 3, Mar. 2, 2018 (Mar. 2, 2018), pp. 220-228, XP036660204, ISSN: 1745-2473, DOI: 10.1038/S41567-018-0062-7 [retrieved on Mar. 2, 2018].

* cited by examiner

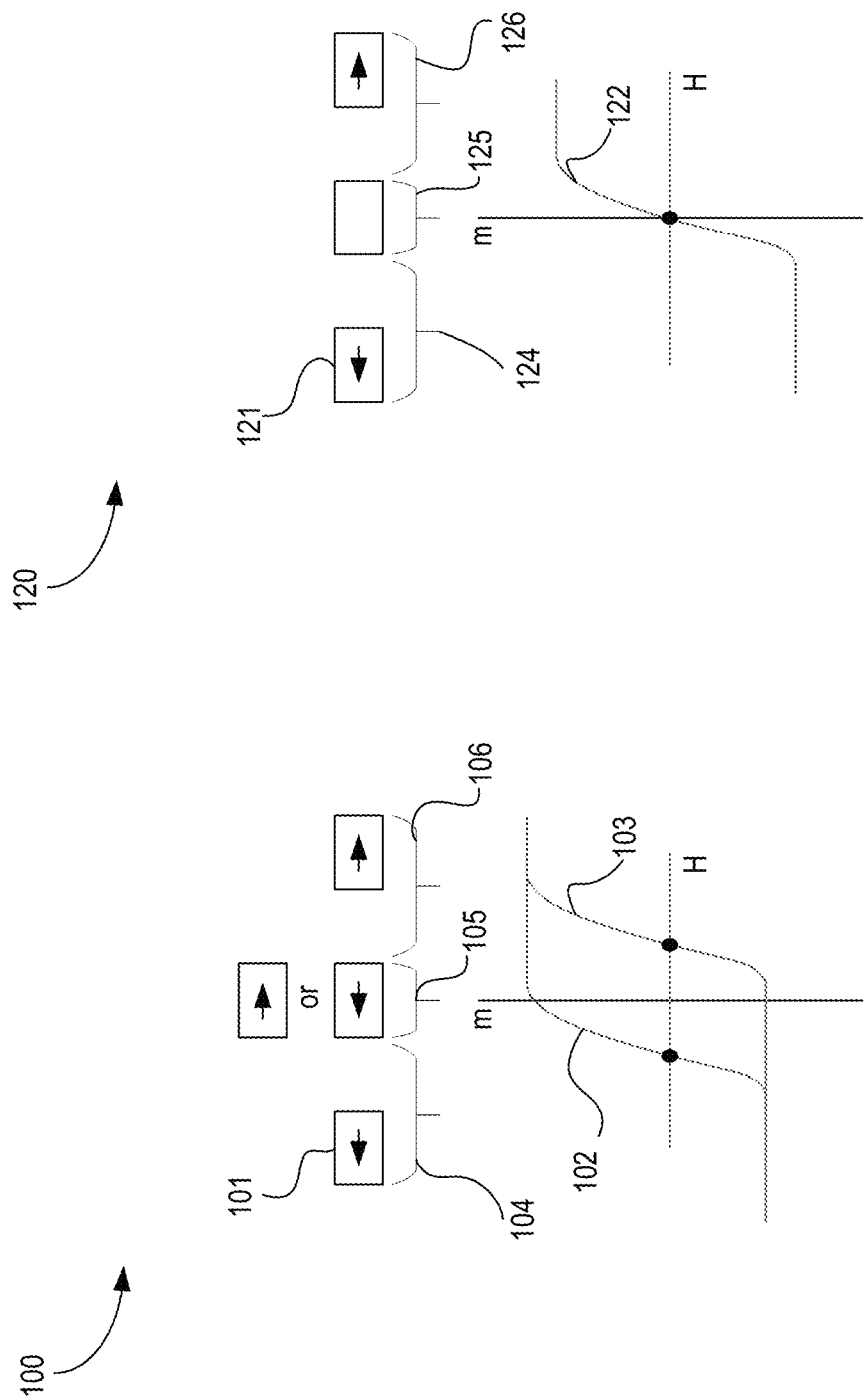

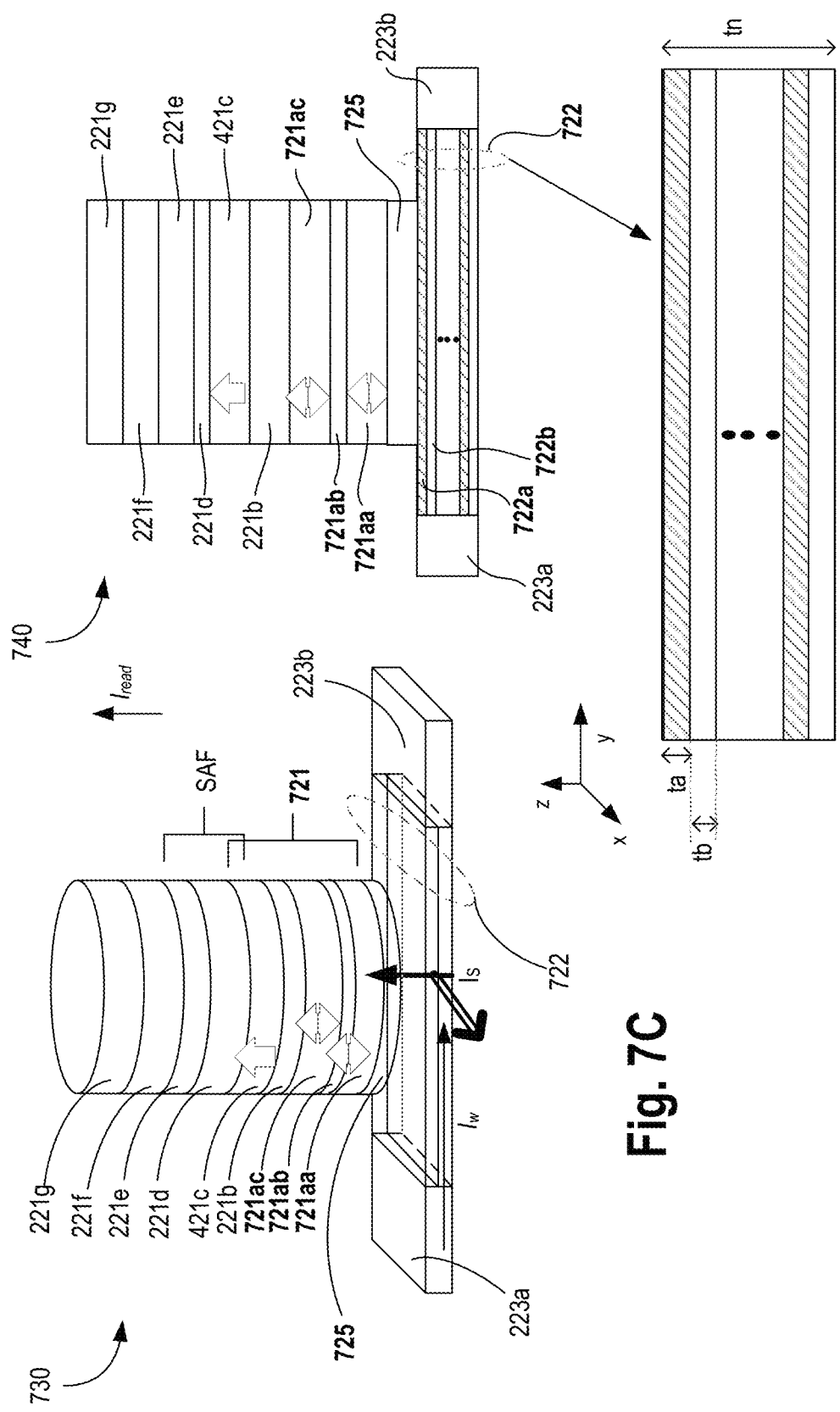

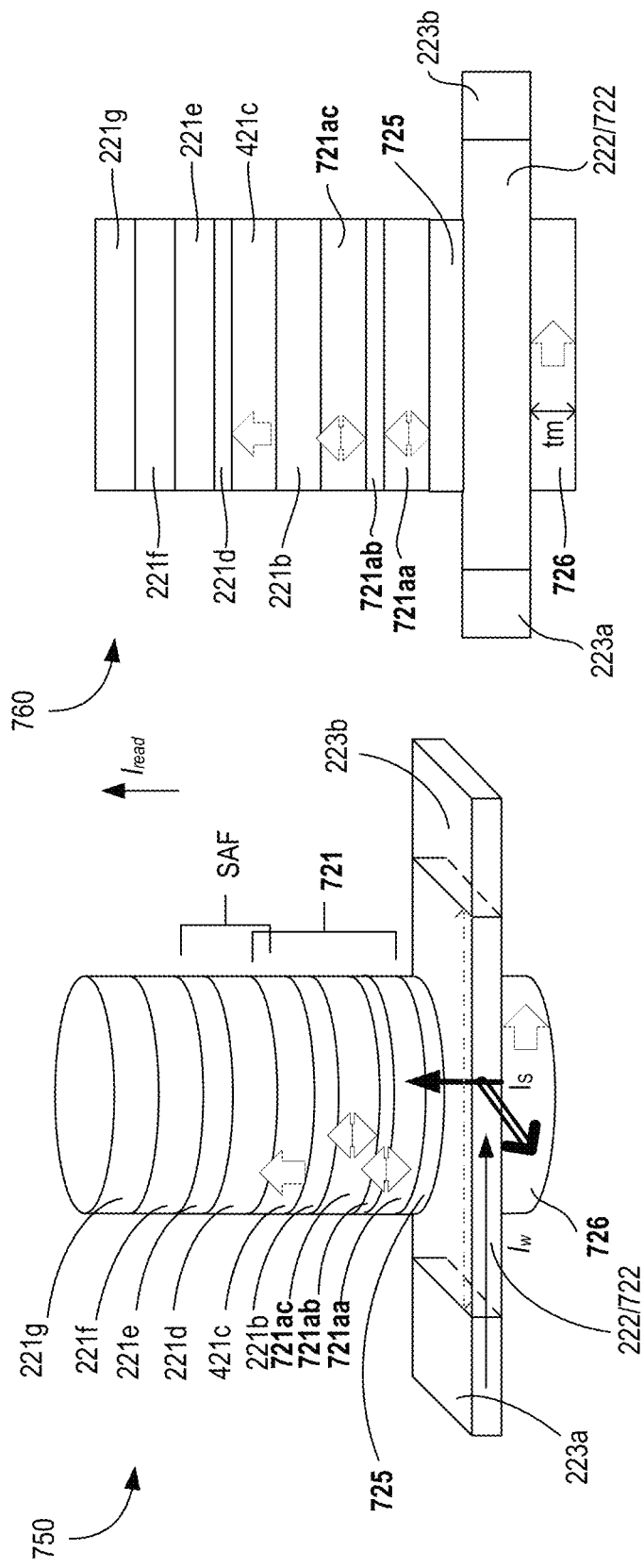

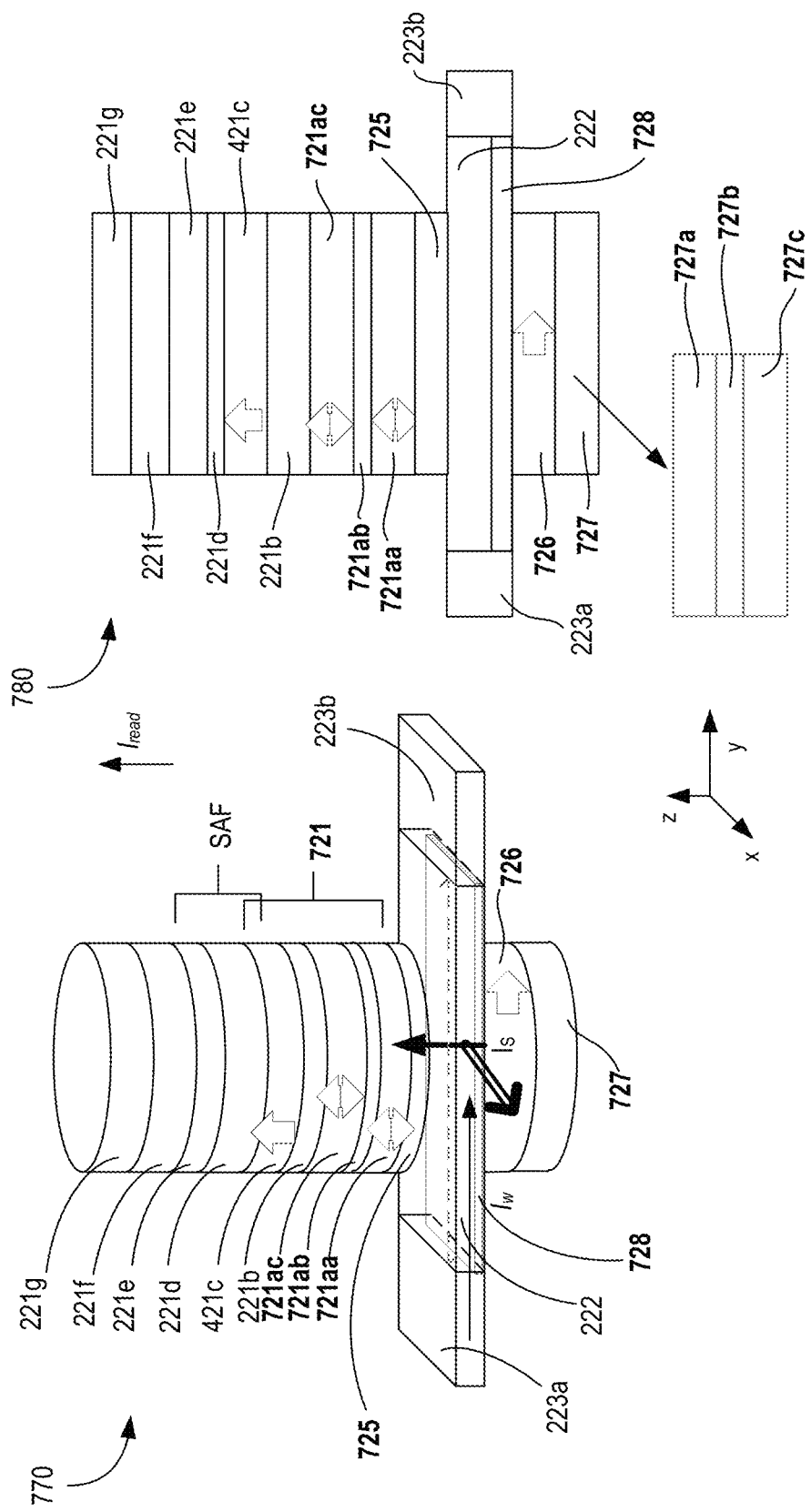

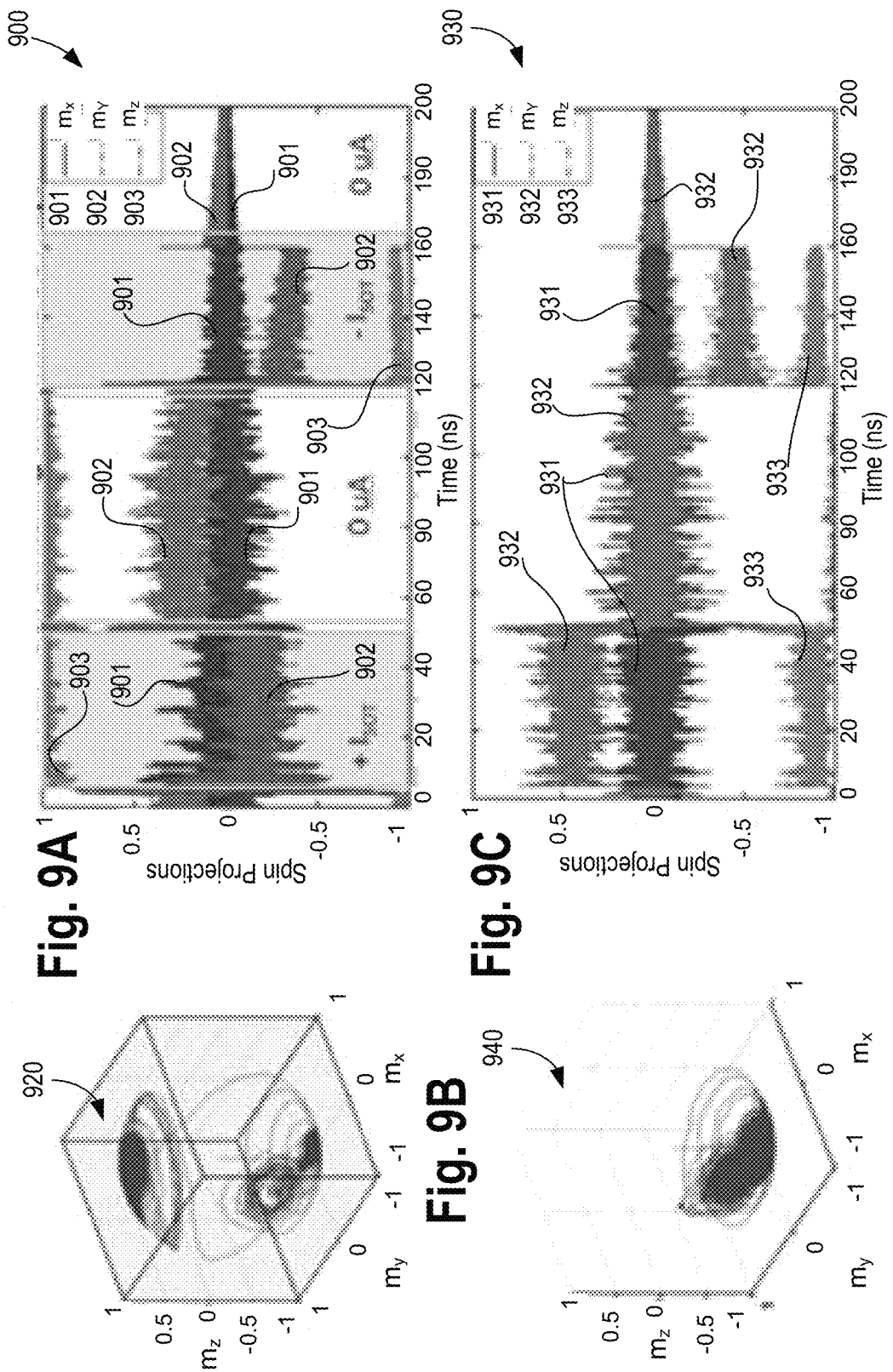

INSERTION LAYER BETWEEN SPIN HALL EFFECT OR SPIN ORBIT TORQUE ELECTRODE AND FREE MAGNET FOR IMPROVED MAGNETIC MEMORY

BACKGROUND

Embedded memory with state retention can enable energy and computational efficiency. However, leading spintronic memory options, for example, spin transfer torque based magnetic random access memory (STT-MRAM), suffer from the problem of high voltage and high write current during the programming (e.g., writing) of a bit-cell. For instance, large write current (e.g., greater than 100 μA) and voltage (e.g., greater than 0.7 V) are required to write a tunnel junction based magnetic tunnel junction (MTJ). Limited write current also leads to high write error rates or slow switching times (e.g., exceeding 20 ns) in MTJ based MRAM. The presence of a large current flowing through a tunnel barrier leads to reliability issues in magnetic tunnel junctions.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to an applied magnetic field for a ferromagnet.

FIG. 1B illustrates a magnetization response to an applied magnetic field for a paramagnet.

FIGS. 7C-D illustrate a 3D view and corresponding cross-section view, respectively, of a device having a magnetic junction with magnets having perpendicular magnetizations, and an insert layer between the magnetic junction and a composite interconnect having antiferromagnetic (AFM) material, according to some embodiments of the disclosure.

FIGS. 7E-F illustrate a 3D view and corresponding cross-section view, respectively, of a device having a magnetic junction with magnets having perpendicular magnetizations, and an insert layer between the magnetic junction and the SOC interconnect, and a via comprising an in-plane magnet adjacent to the SOC interconnect, according to some embodiments of the disclosure.

FIGS. 7I-J illustrate a 3D view and corresponding cross-section view, respectively, of a device having a magnetic junction with magnets having perpendicular magnetizations, and an insert layer between the magnetic junction and the SOC interconnect, where an AFM is embedded in the SOC interconnect, and a via comprising an in-plane magnet which is adjacent to the AFM, according to some embodiments of the disclosure.

FIG. 9A illustrates a plot showing spin polarization capturing switching of a free magnet structure which is exchanged coupled or biased by a magnetic via under an SOC interconnect, and an insert layer between the magnetic junction and the interconnect, according to some embodiments of the disclosure.

FIG. 9B illustrates a magnetization plot associated with FIG. 9A, according to some embodiments of the disclosure.

FIG. 9C illustrates a plot showing spin polarization capturing switching of the free magnet structure which is exchanged coupled or biased by a magnetic via under an SOC interconnect, and an insert layer between the magnetic junction and the interconnect, according to some embodiments of the disclosure.

FIG. 9D illustrates a magnetization plot associated with FIG. 9C, according to some embodiments of the disclosure.

DETAILED DESCRIPTION

Figure 2A:
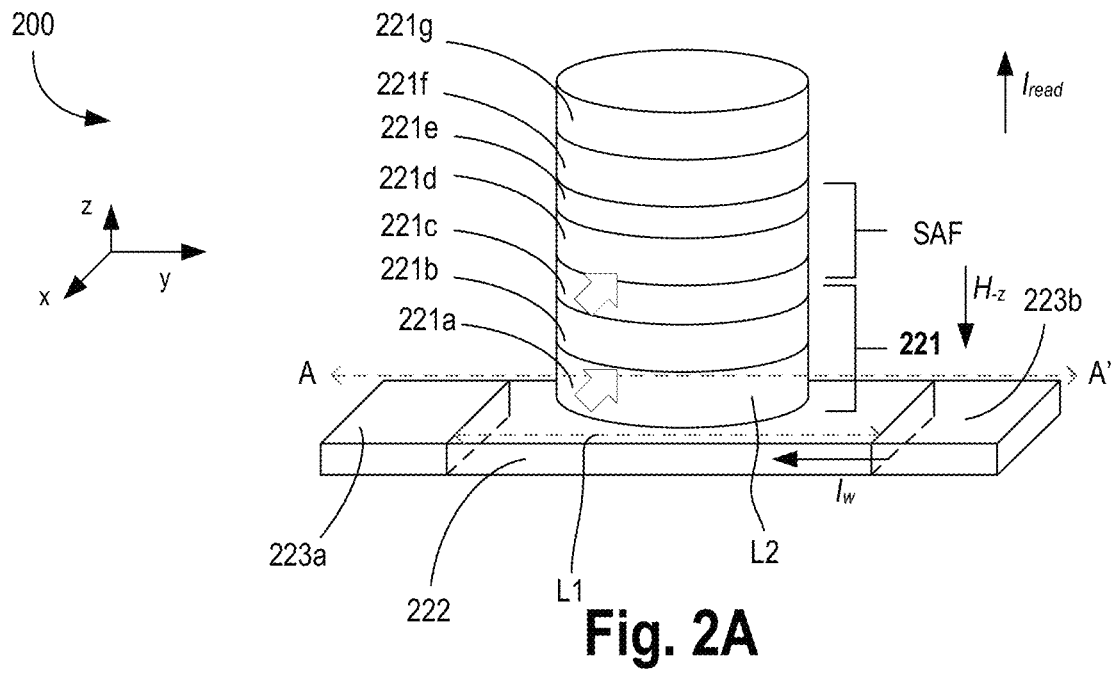
FIGS. 2A-B illustrate a three-dimensional (3D) view and corresponding top view, respectively, of a device having an in-plane magnetic tunnel junction (MTJ) stack coupled to a spin orbit coupling (SOC) interconnect.

Perpendicular Spin Orbit Torque (PSOT) MRAM is passed on using spin orbit torque (SOT) from Heavy metal, two-dimensional (2D) material, Antiferromagnets (AFM) or topological insulator (TI) to switch the perpendicular magnet. Typically, in-plane magnetic field is used for deterministic bidirectional switching of the PSOT MRAM, which can be generated by Antiferromagnetic materials as SOT electrode or magnetically doped heavy metal electrode or magnetic via or by designing a complex free magnet layer stack. The amplitude of the in-plane magnetic field used for efficient switching of the free magnet is dependent on the on the anisotropy of the free magnet layer and the amplitude of Dzyaloshinskii-Moriya interaction (DMI) field. DMI is present at the interface of any SOT electrode and the free layer magnet adjacent to it. Larger DMI means a larger in-plane magnetic field is to be applied to keep the SOT switching efficiently.

Another challenge is the spin memory loss at the interface of the SOT layer and the free magnet layer interface. Spin memory loss can be considered as reduced spin polarization acting on the magnet due to spin conductivity mismatch between the free magnet layer and the SOT electrode. In case of high mismatch, a larger amount of current in the SOT electrode is applied to achieve the same amount of spin torque. Spin memory loss can make PSOT devices inefficient.

Some embodiments describe a spin orbit coupling (SOC/SOT) based magnetic memory with inserts between the SOC/SOT layer or electrode and the free magnet layer of a magnetic junction. In some embodiments, the inserts comprise one or more of: Hf, Ta, W, Ir, Pt, Bi, Cu, Mo, Gd, Ge, Ga, or Au. In some embodiments, the inserts comprise a compound having one of the elements listed above. For example, alloys of Hf, Ta, W, Ir, Pt, Bi, Cu, Mo, Gd, Ge, Ga, or Au can be used for fabricating the inserts. In some embodiments, the inserts comprise a single element from the list above. In some embodiments, the inserts are a non-magnetic compound. In some embodiments, the SOC/SOT electrode comprise two-dimensional (2D) materials. Examples of 2D materials include: Graphene, $Bi_2Se_3$, $Bi_xTeSe_{1-x-y}$, $BixSb_{1-x}$, $WSe_2$, $WTe_2$, $PtSe_2$, $PtTe_2$, $PtTe_2$, $MoSe_2$, $MoS_2$, or $MoTe_2$.

In some embodiments, the device comprises a perpendicular magnet in contact with the insert, which in turn is coupled to an SOC write electrode (e.g., spin Hall effect write electrode), and which is coupled to a magnetic via to produce dipole/exchange bias fields. In some embodiments, the magnetic via comprises an AFM or an in-plane fixed magnet. In some embodiments, in-plane exchange bias from the AFM and/or an in-plane fixed magnet is used to template the magnetic orientation of the free magnets of the magnetic junction. As such, the free magnets of the magnetic junction provide a strong effective in-plane magnet effect. In some embodiments, both an in-plane fixed magnet and an AFM are formed in a via which is coupled to or adjacent to a surface of the SOC electrode such that the magnetic junction is formed on the other surface of the SOC electrode.

In some embodiments, the SOC electrode comprises an AFM. In one such embodiment, the via comprises a magnet with fixed in-plane magnetization. Since the AFM effect is provided by the SOC electrode in this example, an additional AFM may not be formed in the via. In some embodiments, the in-plane fixed magnet under the SOC electrode has a length longer than a length of the magnetic junction. Here, length refers to a distance along a y-axis as described with reference to various figures. In some embodiments, the in-plane magnet is made thick enough so that it is stable. Here, stability generally refers to the permanency of the magnetization direction. An unstable magnet in this example would be one that switches its magnetization upon application of an external field. In some embodiments, the AFM comprises Ir and Mn (or any other AFM) which can template the magnetic orientation of the in-plane magnet in the via.

In some embodiments, the free magnet structure of the magnetic junction comprises at least two free magnets that are coupled by a coupling layer. In some embodiments, the coupling layer comprises one or more of: Ru, Os, Hs, Fe, or other similar transition metals from the platinum group of the periodic table. In some embodiments, the coupling layer(s) are removed so that the free magnets of the free magnet structure or stack are directly connected with one another forming a single magnet (or a composite magnet).

In some embodiments, one or more of the free magnets of the free magnet structure of the magnetic junction comprises a composite magnet. The composite magnet may be a super lattice including a first material and a second material, wherein the first material includes one of: Co, Ni, Fe, or Heusler alloy, and wherein the second material includes one of: Pt, Pd, Ir, Ru, or Ni. In some embodiments, the fixed magnet of the magnetic junction also comprises a composite magnet.

There are many technical effects of the various embodiments. For example, in some embodiments, the out-of-plane magnetization switching enables perpendicular magnet anisotropy (PMA) based magnetic devices (e.g., MRAM and logic) comprising spin orbit effects that generate perpendicular spin currents. The perpendicular magnet switch of some embodiments enables low programming voltages (or higher current for identical voltages) enabled by giant spin orbit effects (GSOE) for perpendicular magnetic memory and logic. The perpendicular magnet switch, of some embodiments, results in lower write error rates which enable faster MRAM (e.g., write time of less than 10 ns). The perpendicular magnet switch of some embodiments decouples write and read paths to enable faster read latencies. The perpendicular magnet switch of some embodiments uses significantly smaller read current through the magnetic junction (e.g., MTJ or spin valve) and provides improved reliability of the tunneling oxide and MTJs. For example, less than 10 µA compared to 100 µA for nominal write is used by the perpendicular magnet switch of some embodiments.

In some embodiments, the inserts reduce the DMI at the interface of the SOT and the magnetic junction to allow for efficient SOC/SOT transduction at low in-plane fields. The inserts also act as a matching layer between the magnetic junction and the SOC/SOT electrode to reduce the spin memory loss effect. In some embodiments, the SOC/SOT electrode is doped with antiferromagnetic (AFM) material or ferromagnetic (FM) material. In some embodiments, the insert allows for simplified magnetic memory design constrains on the AFM/FM doped SOC/SOT electrode or magnetic via based SOC/SOT electrode. As such, more efficient spin orbit coupling base switching of the free magnet is achieved resulting in a lower power perpendicular SOC/SOT magnetic memory. In various embodiments, the fixed in-plane magnet and/or the AFM coupled to one surface of the SOC interconnect provide an additional effective in-plane field which is used for switching the free magnet(s) of the free magnet structure or stack (of the magnetic junction) using spin orbit torque effect. As such, faster switching and lower power switching is achieved for the magnet junction.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

Here, the term "perpendicularly magnetized magnet" (or perpendicular magnet, or magnet with perpendicular magnetic anisotropy (PMA)) generally refers to a magnet having a magnetization which is substantially perpendicular to a plane of the magnet or a device. For example, a magnet with a magnetization which is in a z-direction in a range of 90 (or 270) degrees+/−20 degrees relative to an x-y plane of a device.

Here, the term "in-plane magnet" generally refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "signal" may refer to at least one current signal, voltage signal, magnetic signal, or data/clock signal.

The meaning of "a," "an," and "the" include plural references. The meaning of "in" includes "in" and "on."

For the purposes of present disclosure, the terms "spin" and "magnetic moment" are used equivalently. More rigorously, the direction of the spin is opposite to that of the magnetic moment, and the charge of the particle is negative (such as in the case of electron).

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +1-10% of a predetermined target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in die description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

For the purposes of present disclosure, the terms "spin" and "magnetic moment" are used equivalently. More rigorously, the direction of the spin is opposite to that of the magnetic moment, and the charge of the particle is negative (such as in the case of electron).

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'ln'. For FM 101, the relationship between 'H' and 'ln' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetizations. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hertostructures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, $MnGa$, or $MnGaRu$.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum (Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), Dy$_2$O (dysprosium oxide), Erbium (Er), Er$_2$O$_3$ (Erbium oxide), Europium (Eu), Eu$_2$O$_3$ (Europium oxide), Gadolinium (Gd), Gadolinium oxide (Gd$_2$O$_3$), FeO and Fe$_2$O$_3$ (Iron oxide), Neodymium (Nd), Nd$_2$O$_3$ (Neodymium oxide), KO$_2$ (potassium superoxide), praseodymium (Pr), Samarium (Sm), Sm$_2$O$_3$ (samarium oxide), Terbium (Tb), Tb$_2$O$_3$ (Terbium oxide), Thulium (Tm), Tm$_2$O$_3$ (Thulium oxide), or V$_2$O$_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

Figure 2B:
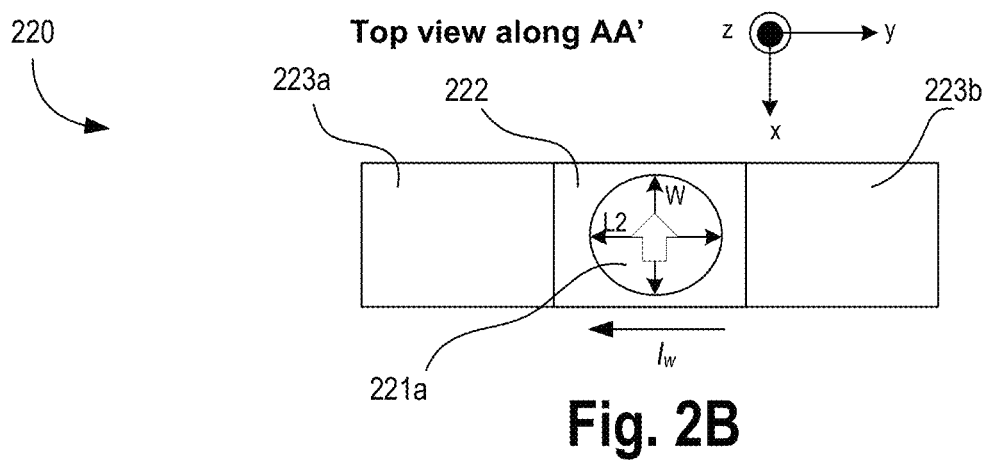

FIGS. 2A-B illustrate a three-dimensional (3D) view 200 and corresponding top view 220, respectively, of device having an in-plane magnetic tunnel junction (MTJ) stack coupled to a spin orbit coupling (SOC) interconnect, where the MTJ stack includes a free magnet layer much smaller than a length of the SOC interconnect.

Here, the stack of layers having magnetic junction 221 is coupled to an electrode 222 (also referred to as interconnect 222 and layer 222) comprising spin Hall effect (SHE) or SOC material (or spin orbit torque (SOT) material), where the SHE material converts charge current I$_W$ (or write current) to spin polarized current Is. The device of FIG. 2A forms a three-terminal memory cell with SHE induced write mechanism and MTJ based read-out. Spin Hall effect is a relativistic spin-orbit coupling phenomenon that can be used to electrically generate or detect spin currents in non-magnetic systems.

When an in-plane current is applied to heavy-metal/ferromagnet bilayer systems, this in-plane current gives rise to spin accumulation in the ferromagnet via spin-orbit interactions. The spin accumulation in the free ferromagnet leads to torques (e.g., SOT) or effective fields acting on the magnetization, thus switching the magnetization of the free ferromagnet. The SOT has two components with different symmetries—Slonczewski-like torque and field-like torque. The origin of the SOT is generally attributed to the bulk spin Hall effect in the heavy metal. The specific structures of the SOT switching scheme demonstrated here are categorized into two types according to the direction of the easy axis of the ferromagnet.

Figure 4A:
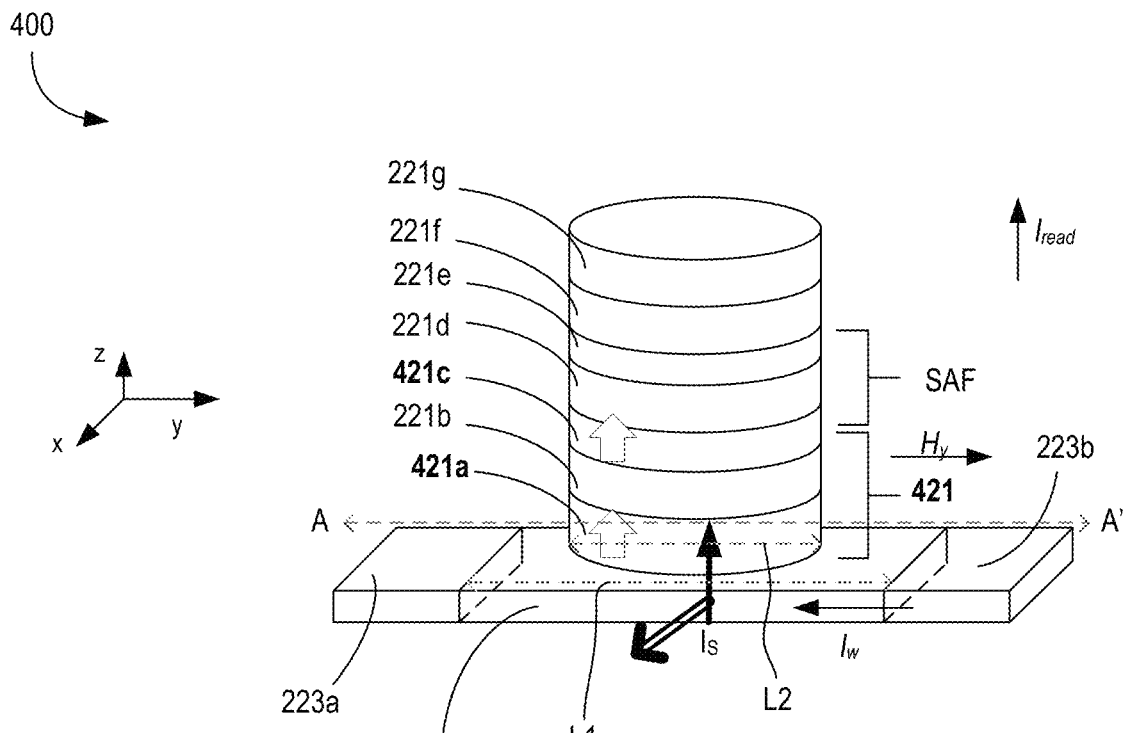
FIGS. 4A-B illustrate a 3D view and corresponding top view, respectively, of a device having an out-of-plane MTJ stack coupled to a SOC interconnect.

FIG. 2A illustrates the easy axis to be in-plane and orthogonal to the current, while FIG. 4A illustrates the easy axis to be perpendicular to the film plane (or device). The switching dynamics of the two are different.

The device of FIG. 2A comprises magnetic junction 221, SHE Interconnect or electrode 222, and non-magnetic metal(s) 223a/b. In one example, MTJ 221 comprises layers 221a, 221b, and 221c. In some embodiments, layers 221a and 221c are ferromagnetic layers. In some embodiments, layer 221b is a metal or a tunneling dielectric.

For example, when the magnetic junction is a spin valve, layer 221b is metal or a metal oxide (e.g., a non-magnetic metal such as Al and/or its oxide) and when the magnetic junction is a tunneling junction, then layer 221b is a dielectric (e.g. MgO, Al$_2$O$_3$). One or both ends along the horizontal direction of SHE Interconnect 222 is formed of non-magnetic metals 223a/b. Additional layers 221d, 221e, 221f, and 221g can also be stacked on top of layer 221c. In some embodiments, layer 221g is a non-magnetic metal electrode.

So as not to obscure the various embodiments, the magnetic junction is described as a magnetic tunneling junction (MTJ). However, the embodiments are also applicable for spin valves. A wide combination of materials can be used for material stacking of magnetic junction 221. For example, the stack of layers 221a, 221b, 221c, 221d, 221e, 221f, and 221g are formed of materials which include: Co$_x$Fe$_y$B$_z$, MgO, Co$_x$Fe$_y$B$_z$, Ru, Co$_x$Fe$_y$B$_z$, IrMn, and Ru, respectively, where 'x,' 'y,' and 'z' are fractions of elements in the alloys. Other materials may also be used to form MTJ 221. MTJ 221 stack comprises free magnetic layer 221a, MgO tunneling oxide 221b, a fixed magnetic layer 221c/d/e which is a combination of CoFe, Ru, and CoFe layers, respectively, referred to as Synthetic Anti-Ferromagnet (SAF), and an Anti-Ferromagnet (AFM) layer 221f. The SAF layer has the property, that the magnetizations in the two CoFe layers are opposite and allows for cancelling the dipole fields around the free magnetic layer such that a stray dipole field will not control the free magnetic layer.

In some embodiments, the free and fixed magnetic layers (221a and 221c, respectively) are ferromagnets (FMs) that are formed of CFGG (i.e., Cobalt (Co), Iron (Fe), Germanium (Ge), or Gallium (Ga) or a combination of them). In some embodiments, FM 221a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: Cu$_2$MnAl, Cu$_2$MnIn, Cu$_2$MnSn, Ni$_2$MnAl, Ni$_2$MnIn, Ni$_2$MnSn, Ni$_2$MnSb, Ni$_2$MnGa Co$_2$MnAl, Co$_2$MnSi, Co$_2$MnGa, Co$_2$MnGe, Pd$_2$MnAl, Pd$_2$MnIn, Pd$_2$MnSn, Pd$_2$MnSb, Co$_2$FeSi, Co$_2$FeAl, Fe$_2$VAl, Mn$_2$VGa, Co$_2$FeGe, MnGa, or MnGaRu.

The thickness of a ferromagnetic layer (e.g., fixed or free magnetic layer) may determine its equilibrium magnetization direction. For example, when the thickness of the ferromagnetic layer 221a/c is above a certain threshold (depending on the material of the magnet, e.g. approximately 1.5 nm for CoFe), then the ferromagnetic layer exhibits magnetization direction which is in-plane. Likewise, when the thickness of the ferromagnetic layer 221a/c is below a certain threshold (depending on the material of the magnet), then the ferromagnetic layer 221a/c exhibits magnetization direction which is perpendicular to the plane of the magnetic layer as illustrated with reference to FIGS. 4A-B.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or L1$_0$-type of crystals, where L1$_0$ is a type of crystal class which exhibits perpendicular magnetizations), can also determine the direction of magnetization.

Referring back to FIG. 2A, in some embodiments, SHE interconnect 222 (or the write electrode) includes 3D materials such as one or more of β-Tantalum (β-Ta), Ta, β-Tungsten ((β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, SHE Interconnect 222 transitions into high conductivity non-magnetic metal(s) 223a/b to reduce the resistance of SHE Interconnect 222. The non-magnetic metal(s) 223a/b include one or more of: Cu, Co, α-Ta, Al, CuSi, or NiSi.

In FIG. 2A, the switching layer 221a has its easy axis along the plane (e.g., y plane) direction. For this type, an external field along the z-axis, Hz, is applied to break the symmetry and achieve bipolar switching. Assuming that the driving force for switching originates from the spin Hall effect in interconnect 222, the critical current density $J_c$ is given by:

$$J_c = \frac{2e}{\hbar} \frac{\alpha M_s t_F}{\theta_{SH}^{eff}} \left( H_{K,in}^{eff} + \frac{H_{K,out}^{eff}}{2} \right)$$

where $\alpha$ is the Gilbert damping constant, e is the elementary charge, h is the Dirac contact, $\theta_{SH}^{eff}$ is the effective spin Hall angle, $M_s$ is the saturation magnetization, $t_F$ is the thickness of the ferromagnet layer 221a along the z-direction, $H_{K,in}^{eff}$ is in-plane effective anisotropy field, and $H_{K,out}^{eff}$ is the out-of-plane effective anisotropy field of the ferromagnet layer 221a.

In this example, the applied current $I_w$ is converted into spin current $I_s$ by SHE Interconnect 222 (also referred to as the spin orbit coupling interconnect). This spin current switches the direction of magnetization of the free layer and thus changes the resistance of MTJ 221. However, to read out the state of MTJ 221, a sensing mechanism is needed to sense the resistance change.

The magnetic cell is written by applying a charge current via SHE Interconnect 222. The direction of the magnetic writing in free magnet layer 221a is decided by the direction of the applied charge current. Positive currents (e.g., currents flowing in the +y direction) produce a spin injection current with transport direction (along the +z direction) and spins pointing to the +x direction. The injected spin current in turn produces spin torque to align the free magnet 221a (coupled to the SHE layer 222 of SHE material) in the +x direction. Negative currents (e.g., currents flowing in the −y direction) produce a spin injection current with transport direction (along the +z direction) and spins pointing to the −x direction. The injected spin current in-turn produces spin torque to align the free magnet 221a (coupled to the SHE material of layer 222) in the −x direction. In some embodiments, in materials with the opposite sign of the SHE/SOC effect, the directions of spin polarization and thus of the free layer magnetization alignment are reversed compared to the above. In some embodiments, the magnets 221a and/or 221c are paramagnets. In some embodiments, the magnets 221a and/or 221c can be a combination of ferromagnets or paramagnets. For example, magnet 221a is a ferromagnet while magnet 221c is a paramagnet. In another example, magnet 221c is a ferromagnet while magnet 221a is a paramagnet.

Figure 2C:
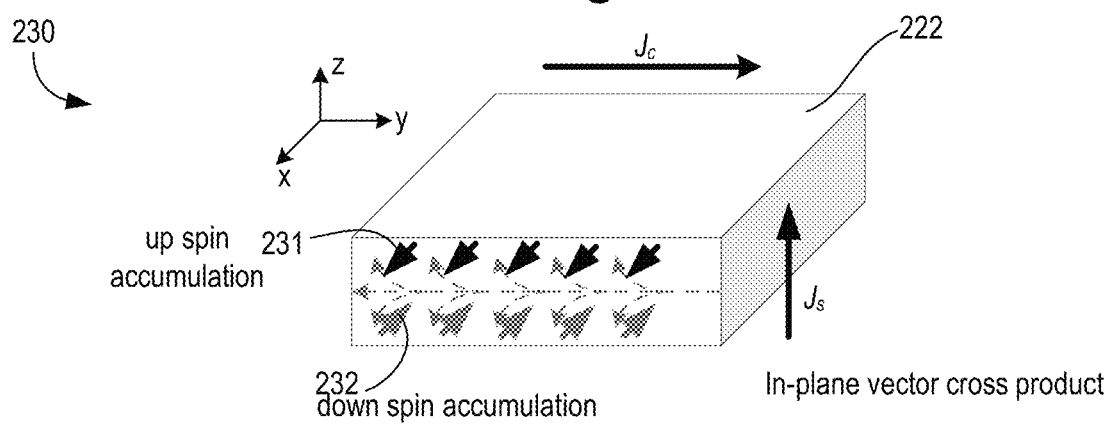
FIG. 2C illustrates a cross-section of the SOC interconnect with electrons having their spins polarized in-plane and deflected up and down resulting from a flow of charge current.

FIG. 2C illustrates a cross-section 230 of SOC interconnect 222 with electrons having their spins polarized in-plane and deflected up and down resulting from a flow of charge current. In this example, positive charge current represented by $J_c$ produces spin-front (e.g., in the +x direction) polarized current 301 and spin-back (e.g., in the −x direction) polarized current 302. The injected spin current $\vec{I}_s$ generated by a charge current $\vec{I}_c$ in the write electrode 222 is given by:

$$\vec{I}_s = P_{SHE}(w,t,\lambda_{sf},\theta_{SHE})(\vec{I}_c \times \hat{z}) \quad (1)$$

where, the vector of spin current $\vec{I}_s = \vec{I}_\uparrow - \vec{I}_\downarrow$ points in the direction of transferred magnetic moment and has the magnitude of the difference of currents with spin along and opposite to the spin polarization direction, $\hat{z}$ is the unit vector perpendicular to the interface, $P_{SHE}$ is the spin Hall injection efficiency which is the ratio of magnitude of transverse spin current to lateral charge current, w is the width of the magnet, t is the thickness of the SHE Interconnect (or write electrode) 222, $\lambda_{sf}$ is the spin flip length in SHE Interconnect 222, $\theta_{SHE}$ is the spin Hall angle for SHE Interconnect 222 to free ferromagnetic layer interface. The injected spin angular momentum per unit time responsible for the spin torque is given by:

$$\vec{S} = \hbar \vec{I}_s / 2e \quad (2)$$

The generated spin up and down currents 231/232 are equivalent to the spin polarized current per unit area (e.g., $\vec{J}_s$) given by:

$$\vec{J}_s = \theta_{SHE}(\vec{J}_c \times \hat{z}) \quad (3)$$

This spin to charge conversion is based on Tunnel Magneto Resistance (TMR) which is highly limited in the signal strength generated. The TMR based spin to charge conversion has low efficiency (e.g., less than one).

Figure 3A:
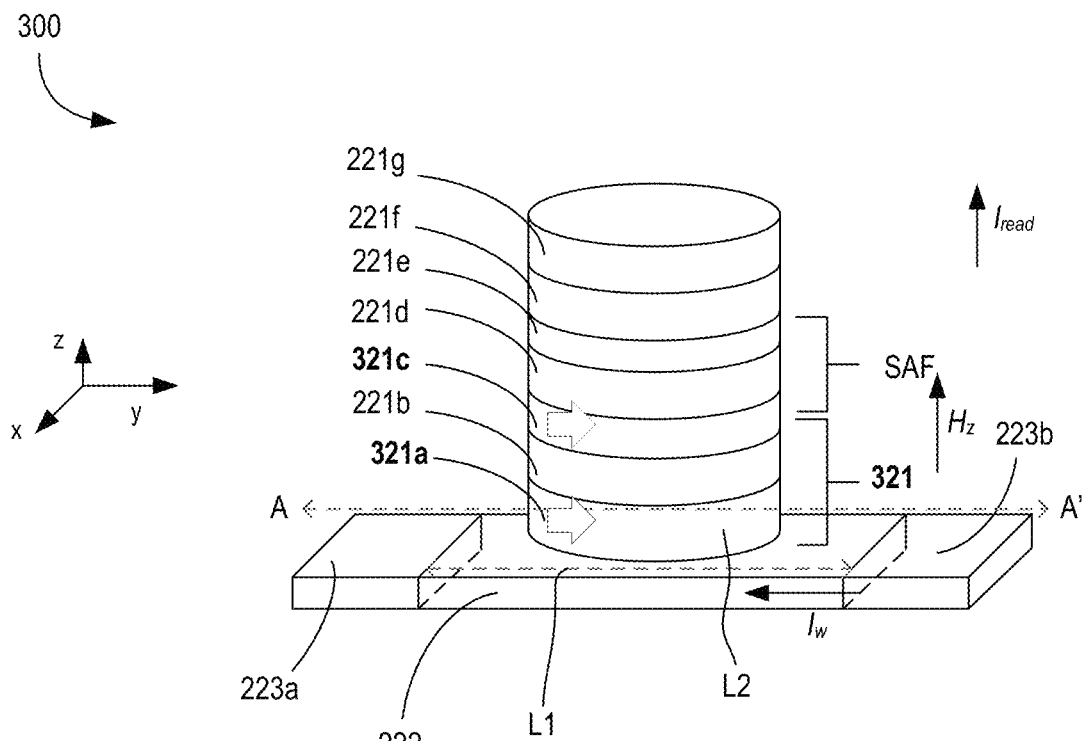
FIGS. 3A-B illustrate a 3D view and corresponding top view, respectively, of a device having an in-plane MTJ stack coupled to a SOC interconnect, where the in-plane magnetization is co-linear with a direction of current.
Figure 3B:
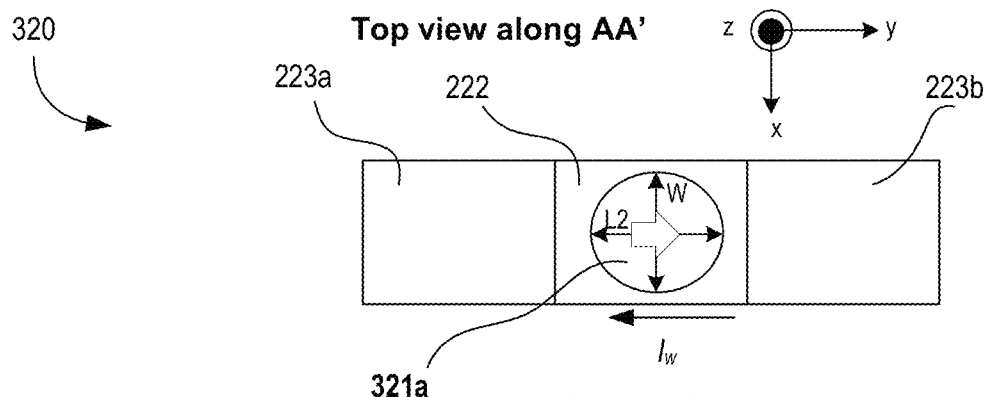

FIGS. 3A-B illustrate a 3D view 300 and corresponding top view 320, respectively, of device having an in-plane MTJ stack coupled to SOC interconnect 222. Compared to the device of FIGS. 2A-B, here, switching layer 321a has easy axis in the film plane (e.g., y plane) and collinear with the current along the y-axis. The fixed magnet 321c also has magnetization along the y-plane. Material wise, magnets 321a/c are the same as magnets 221a/c, but with different magnetic orientation along the same plane. In some embodiments, the easy axis is parallel to the current flowing along the y axis. With the application of an external magnetic field, $H_z$, along the z direction, bipolar switching is achieved.

Figure 4B:
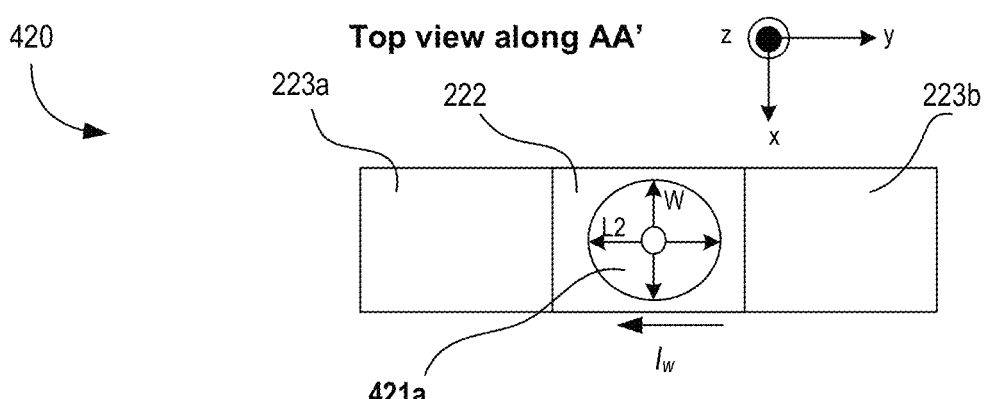

FIGS. 4A-C illustrate a 3D view 400 and corresponding top view 420, respectively, of device having an out-of-plane MTJ stack coupled to SOC interconnect 222. Compared to the embodiments of FIGS. 2-3, here free and fixed magnet layers (or structures) 421a and 421c, respectively, have perpendicular magnetic anisotropy (PMA). For example, fixed magnet structure 421c has a magnetization pointing along the z-direction and is perpendicular to the x-y plane of the device 400. Likewise, fixed magnet structure 421a has a magnetization pointing along the z-direction and is perpendicular to the x-y plane of the device 400.

In some embodiments, the magnets with PMA comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; and materials with tetragonal crystal structure. In some embodiments, the magnet with PMA is formed of a single layer of one or more materials. In some embodiments, the single layer is formed of MnGa.

$L1_0$ is a crystallographic derivative structure of a FCC (face centered cubic lattice) structure and has two of the faces occupied by one type of atom and the corner and the other face occupied with the second type of atom. When phases with the $L1_0$ structure are ferromagnetic the magnetization vector usually is along the [0 0 1] axis of the crystal. Examples of materials with $L1_0$ symmetry include CoPt and FePt. Examples of materials with tetragonal crystal structure and magnetic moment are Heusler alloys such as CoFeAl, MnGe, MnGeGa, and MnGa.

In some embodiments, the free and fixed magnetic layers (421a and 421c, respectively) are FMs that are formed of CFGG. In some embodiments, FM 421a/c are formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, the magnets 421a and/or 421c can be a combination of ferromagnets or paramagnets. For example, magnet 421a is a ferromagnet while magnet 421c is a paramagnet. In another example, magnet 421c is a ferromagnet while magnet 221a is a paramagnet. In some embodiments, magnets 421a and/or 421c are paramagnets.

In FIG. 4A, the switching layer 421a has its easy axis along the out-of-plane (z) direction. For this type, an external field along the y-axis, $H_y$, is applied to break the symmetry and achieve bipolar switching. Assuming that the driving force for switching originates from the spin Hall effect in interconnect 222, the critical current density $J_C$ is given by:

$$J_c = \frac{2e}{\hbar} \frac{M_s t_F}{\theta_{SH}^{eff}} \left( \frac{H_K^{eff}}{2} - \frac{H_y}{\sqrt{2}} \right)$$

where e is the elementary charge, h is the Dirac contact, $\theta_{SH}^{eff}$ is the effective spin Hall angle, and $M_s$, $t_F$, and $H_K^{eff}$ are the saturation magnetization, thickness and effective anisotropy field of the ferromagnet layer 421a, respectively.

In some embodiments, SHE interconnect 222 comprises a spin orbit 2D material which includes one or more of: graphene, $TiS_2$, $WS_2$, $MoS_2$, $TiSe_2$, $WSe_2$, $MoSe_2$, $B_2S_3$, $Sb_2S_3$, $Ta_2S$, $Re_2S_7$, $LaCPS_2$, $LaOAsS_2$, $ScOBiS_2$, $GaOBiS_2$, $AlOBiS_2$, $LaOSbS_2$, $BiOBiS_2$, $YOBiS_2$, $InOBiS_2$, $LaOBiSe_2$, $TiOBiS_2$, $CeOBiS_2$, $PrOBiS_2$, $NdOBiS_2$, $LaOBiS_2$, or $SrFBiS_2$. In some embodiments, the SHE interconnect 222 comprises spin orbit material which includes one of a 2D material or a 3D material, wherein the 3D material is thinner than the 2D material. In some embodiments, the SHE interconnect 222 comprises a spin orbit material which includes materials that exhibit Rashba-Bychkov effect.

In some embodiments, the 2D materials include one or more of: Mo, S, W, Se, Graphene, $MoS_2$, $WSe_2$, $WS_2$, or $MoSe_2$. In some embodiments, the 2D materials include an absorbent which includes one or more of: Cu, Ag, Pt, Bi, Fr, or H absorbents. In some embodiments, the SOC structures comprise a spin orbit material which includes materials that exhibit Rashba-Bychkov effect. In some embodiments, material which includes materials that exhibit Rashba-Bychkov effect comprises materials $ROCh_2$, where 'R' includes one or more of: La, Ce, Pr, Nd, Sr, Sc, Ga, Al, or In, and where "Ch" is a chalcogenide which includes one or more of: S, Se, or Te.

While the embodiments of FIGS. 2-3 illustrate both magnets having magnetizations in the same plane (e.g., either in-plane or perpendicular relative to the x-y plane of the device), the magnetization direction of fixed and free magnets can be in different planes. For example, fixed magnetic layer 221c is perpendicular relative to the magnetization direction of free magnetic layer 221a (e.g., magnetization directions of the free and fixed magnetic layers are not parallel, rather they are orthogonal). In another example, the magnetization direction of free magnetic layer 221a is in-plane (e.g., along the x-y plane of the device) while the magnetization direction of fixed magnetic layer 221c is perpendicular to the x-y plane of the device. In another case, magnetization direction of fixed magnetic layer 221a is in-plane (e.g., along the x-y plane of the device) while the magnetization direction of free magnetic layer 221c is perpendicular to the x-y plane of the device.

The switching dynamics of device 300 of FIG. 3A is similar to those of device 400 of FIG. 4A, where the magnetization polarity changes as soon as the torque is exerted. This is in contrast to the dynamics device 200 of FIG. 2A, where many precessions take place before the polarity changes. As such, devices 300/400 allow a shorter switching time than the switching time of device 200, in accordance with some embodiments.

Figure 5A:
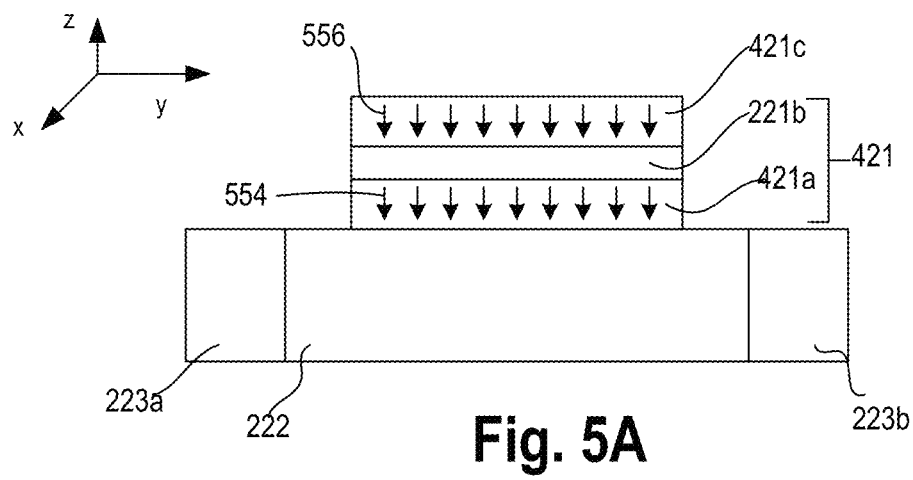
FIGS. 5A-C illustrate a mechanism for switching an out-of-plane MTJ memory device (e.g. device of FIG. 4A) formed on a spin orbit torque electrode.
Figure 5B:
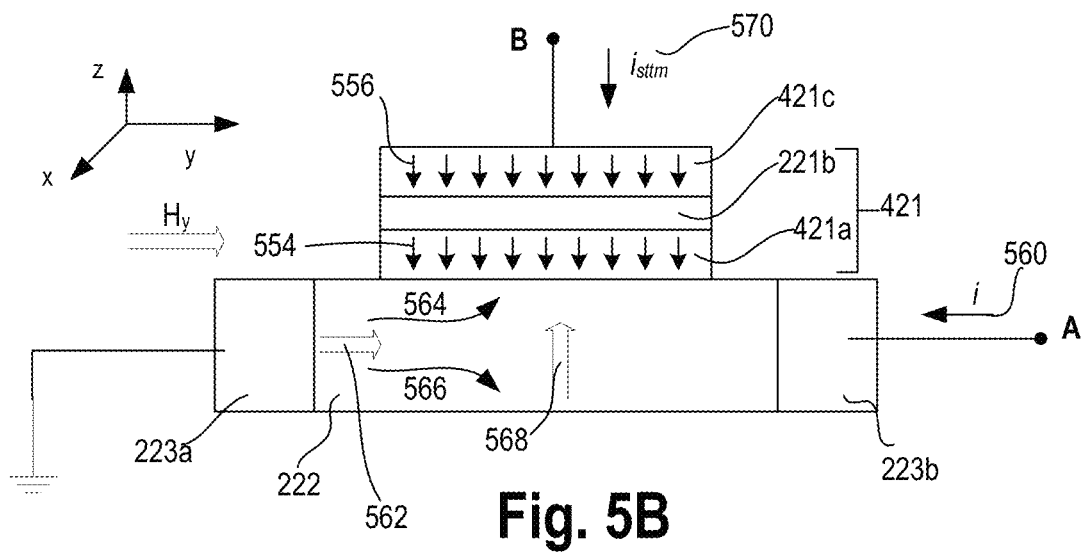
Figure 5C:
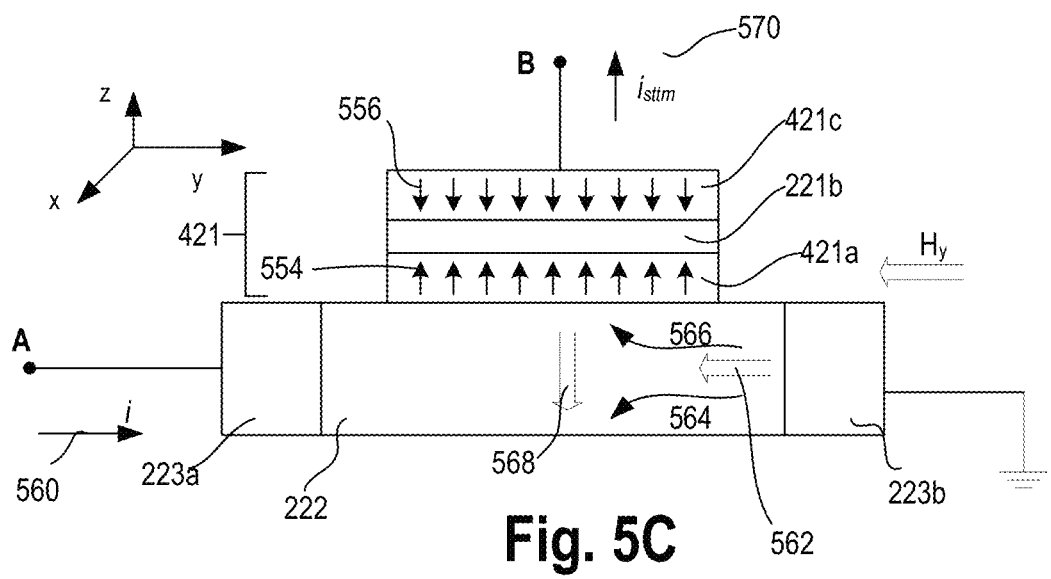

FIGS. 5A-C illustrate a mechanism for switching an MTJ memory device (e.g., device 400) formed on spin orbit torque electrode 222.

FIG. 5A illustrates an MTJ memory device (e.g., device 400) where MTJ 421 is disposed on a spin orbit torque electrode 222, and where a magnetization 554 of the free magnet 421a (also referred to as storage layer 421a) is in the same direction as a magnetization 556 of the fixed magnet 421c. In some embodiments, the direction of magnetization 554 of the storage layer 421a and the direction of magnetization 556 of the fixed magnet 421c are both in the negative z-direction as illustrated in FIG. 5A. When the magnetization 554 of the storage layer 421a is in the same direction as a magnetization 556 of the fixed magnet 421c, MTJ memory device 400 is in a low resistance state. Conversely, when the magnetization 554 of the storage layer 421a is in the opposite direction as a magnetization 556 of the fixed magnet 421c, MTJ memory device 400 is in a high resistance state.

FIG. 5B illustrates a SOT memory device (e.g., device 400) switched to a high resistance state. In an embodiment, a reversal in the direction of magnetization 554 of the storage layer 421a in FIG. 5B compared to the direction of magnetization 554 of the storage layer 421a is brought about by (a) inducing a spin hall current 568 in the spin orbit torque electrode 222 in the y-direction and (b) by applying a spin torque transfer current 570, $i_{STTM}$, (by applying a positive voltage at terminal B with respect to ground C), and/or (c) by applying an external magnetic field, $H_y$, in the y-direction.

In an embodiment, a charge current 560 is passed through the spin orbit torque electrode 222 in the negative y-direction (by applying a positive voltage at terminal A with respect to ground C). In response to the charge current 560, an electron current 562 flows in the positive y-direction. The electron current 562 includes electrons with two opposite spin orientations and experience a spin dependent scattering phenomenon in the spin orbit torque electrode 222.

The electron current 562 includes electrons with two opposing spin orientations, a type I electron 566, having a spin oriented in the negative x-direction and a type II electron 564 having a spin oriented in the positive x-direction. In some embodiments, electrons constituting the electron current 562 experience a spin dependent scattering phenomenon in the spin orbit torque electrode 222. The spin dependent scattering phenomenon is brought about by a spin-orbit interaction between the nucleus of the atoms in the spin orbit torque electrode 222 and the electrons in the electron current 562. The spin dependent scattering phenomenon causes type I electrons 566, whose spins are oriented in the negative x-direction, to be deflected upwards towards an uppermost portion of the spin orbit torque electrode 222 and type II electrons 564 whose spins are oriented in the positive x-direction to be deflected downwards towards a lowermost portion of the spin orbit torque electrode 222.

The separation between the type I electron spin angular moment 566 and the type II electron spin angular moment 564 induces a polarized spin diffusion current 568 in the spin orbit torque electrode 222. In some embodiments, the polarized spin diffusion current 568 is directed upwards toward the free magnet 421a of the MTJ memory device 400 as depicted in FIG. 5B. The polarized spin diffusion current 568 induces a spin hall torque on the magnetization 554 of the free magnet 421a. The spin hall torque rotates the magnetization 554 to a temporary state pointing in the negative x-direction. In some embodiments, to complete the magnetization reversal process an additional torque is applied. The $i_{STTM}$ current 570 flowing through the MTJ memory device 400 exerts an additional torque on the magnetization 554 of the storage layer 421a. The combination of spin hall torque and spin transfer torque causes flipping of magnetization 554 in the storage layer 421a from the intermediate magnetization state (negative x-direction) to a positive z-direction illustrated in FIG. 5B. In some embodiments, an additional torque can be exerted on the storage layer 421a by applying an external magnetic field, $H_y$, in the y-direction, as illustrated in FIG. 5B, instead of applying an $i_{STTM}$ current 570.

FIG. 5C illustrates a SOT memory device switched to a low resistance state. In an embodiment, a reversal in the direction of magnetization 554 of the storage layer 421a in FIG. 5C compared to the direction of magnetization 554 of the storage layer 421a in FIG. 5B is brought about by (a) reversing the direction of the spin hall current 568 in the spin orbit torque electrode 222 and (b) by reversing the direction of the $i_{STTM}$ current 570, and/or (c) by reversing the direction of the external magnetic field, $H_y$.

Figure 6B:
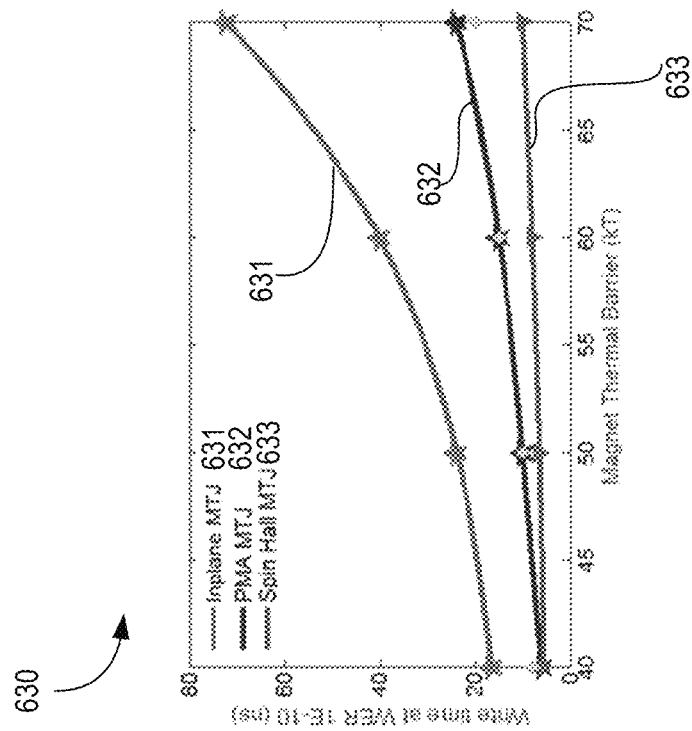
FIG. 6B illustrates a plot comparing reliable write times for spin Hall MRAM and spin torque MRAM.
Figure 6A:
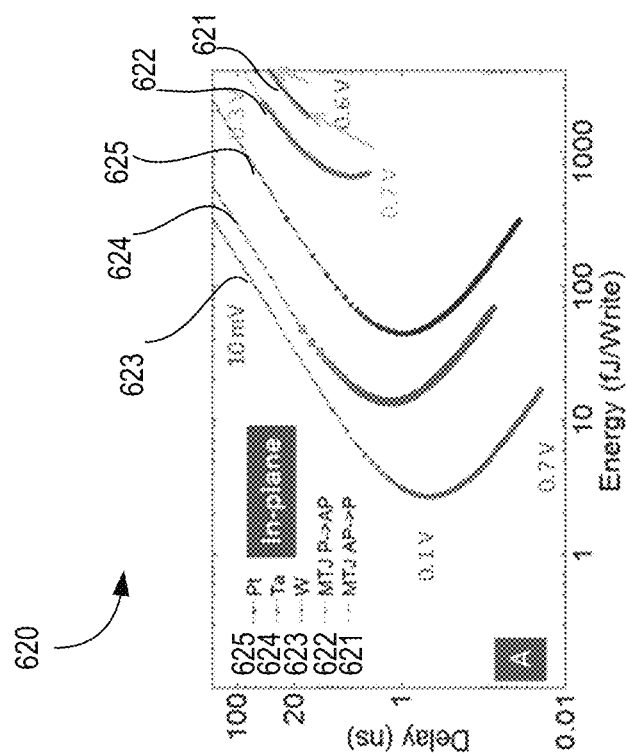
FIG. 6A illustrates a plot showing write energy-delay conditions for one transistor and one MTJ with spin Hall effect (SHE) material (e.g., device of FIGS. 2-3) compared to traditional MTJs.

FIG. 6A illustrates plot 620 showing write energy-delay conditions for one transistor and one MTJ with SHE material (e.g., one of device 200 or 300) compared to traditional MTJs. FIG. 6B illustrates plot 630 showing write energy-delay conditions for one transistor and one MTJ with SHE material (e.g., one of device 200 or 300) compared to traditional MTJs. Here, the x-axis is energy per write operation in femto-Joules (fJ) while the y-axis is delay in nanoseconds (ns).

Here, the energy-delay trajectory of SHE and MTJ devices (e.g., one of device 200 or 300) are compared for in-plane magnet switching as the applied write voltage is varied. The energy-delay relationship (for in-plane switching) can be written as:

$$E(\tau) = R_{write} I_{co}^2 \frac{\left(\tau + \tau_0 \ln\left(\frac{\pi}{2\theta_0}\right)\right)^2}{\tau} = \frac{4}{h^2} \frac{R_{write}}{P^2} \frac{1}{\tau}\left(\mu_0 e\alpha \frac{M_s}{2}\left(\tau + \tau_0 \ln\left(\frac{\pi}{2\theta_0}\right)\right)^2\right) W$$

where $R_{write}$ is the write resistance of the device (resistance of SHE electrode or resistance of MTJ-P or MTJ-AP, where MTJ-P is a MTJ with parallel magnetizations while MTJ-AP is an MTJ with anti-parallel magnetizations, $\mu_0$ is vacuum permeability, e is the electron charge. The equation shows that the energy at a given delay is directly proportional to the square of the Gilbert damping a. Here the characteristic time, $\tau_0=M_s Ve/I_c P\mu_B$ varies as the spin polarization varies for various SHE metal electrodes (e.g., 623, 624, 625). Plot 620 shows five curves 621, 622, 623, 624, and 625. Curves 621 and 622 show write energy-delay conditions using traditional MTJ devices without SHE material.

For example, curve 621 shows the write energy-delay condition caused by switching a magnet from anti-parallel (AP) to parallel (P) state, while curve 622 shows the write energy-delay condition caused by switching a magnet from P to AP state. Curves 622, 623, and 624 show write energy-delay conditions of an MTJ with SHE material. Clearly, write energy-delay conditions of an MTJ with SHE material (e.g., one of device 200 or 300) is much lower than the write energy-delay conditions of an MTJ without SHE material (device not shown). While the write energy-delay of an MTJ with SHE material (e.g., one of device 200 or 300) improves over a traditional MTJ without SHE material, further improvement in write energy-delay is desired.

FIG. 6B illustrates plot 630 comparing reliable write times for spin Hall MRAM and spin torque MRAM. There are three cases considered in plot 630. Waveform 631 is the write time for in-plane MTJ, waveform 632 is the write time for PMA MTJ, and waveform 633 is the write time for spin Hall MTJ. The cases considered here assume a 30×60 nm magnet with 40 kT energy barrier and 3.5 nm SHE electrode thicknesses. The energy-delay trajectories of the devices are obtained assuming a voltage sweep from 0 V to 0.7 V in accordance to voltage restrictions of scaled CMOS. The energy-delay trajectory of the SHE-MTJ devices exhibits broadly two operating regions A) Region 1 where the energy-delay product is approximately constant ($\tau_d < M_s Ve/I_c P\mu_B$), B), and Region 2 where the energy is proportional to the delay $\tau_d > M_s Ve/I_c P\mu_B$. The two regions are separated by energy minima at $\tau_{opt} = M_s Ve/I_c P\mu_B$ where minimum switching energy is obtained for the spin torque devices.

The energy-delay trajectory of the STT-MTJ (spin transfer torque MTJ) devices is limited with a minimum delay of 1 ns for in-plane devices at 0.7 V maximum applied voltage, the switching energy for P-AP and AP-P are in the range of 1 pJ/write. In contrast, the energy-delay trajectory of SHE-MTJ (in-plane anisotropy) devices can enable switching times as low as 20 ps (β-W with 0.7 V, 20 fJ/bit) or switching energy as small as 2 fJ (β-W with 0.1 V, 1.5 ns switching time).

Figures 7A, 7B:
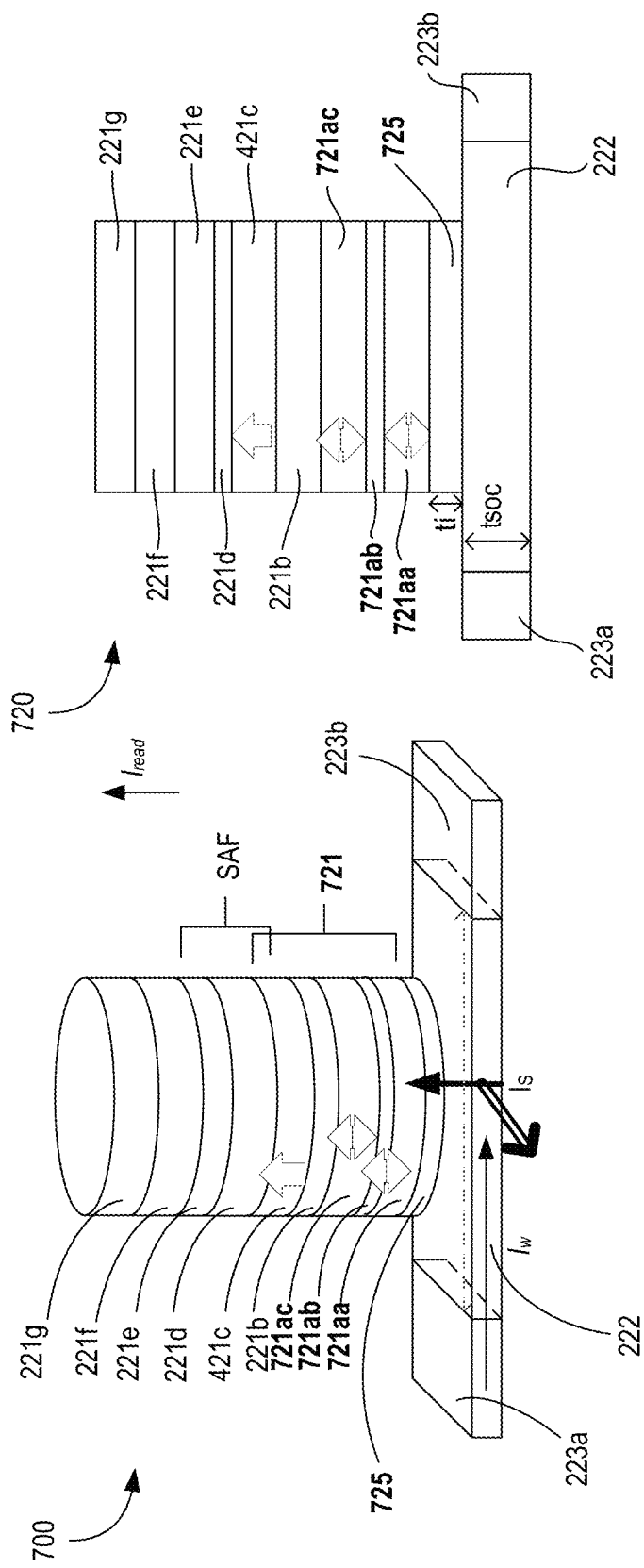
FIGS. 7A-B illustrate a 3D view and corresponding cross-section view, respectively, of a device having a magnetic junction with magnets having perpendicular magnetizations, and an insert layer between the magnetic junction and the SOC interconnect, according to some embodiments of the disclosure.

FIGS. 7A-B illustrate a 3D view 700 and corresponding cross-section view 720, respectively, of a device having a magnetic junction with magnets having perpendicular magnetizations, and an insert layer between the magnetic junction and the SOC interconnect, according to some embodiments of the disclosure.

The device of FIG. 7A is similar to the device of FIG. 4A. Here, the free magnet 421a of FIG. 4A is replaced with a structure comprising a stack of layers or films. The magnetic junction is illustrated by reference sign 721 where the layers under layer 221b (e.g., dielectric or metal/metal-oxide) together form the free magnet structure comprising the free magnet of the junction.

In some embodiments, the structure replacing free magnet 421a comprises at least two free magnets 721aa and 721ac with a coupling layer 721ab between them, where one of the free magnet couples to (or is adjacent to) an insert layer 725. In some embodiments, the insert layer 725 couples to (or is adjacent to) the SOC electrode 222.

In some embodiments, the insert layer 725 comprises one or more of: Hf, Ta, W, Ir, Pt, Bi, Cu, Mo, Gd, Ge, Ga, or Au. In some embodiments, the inserts comprise a compound having one of the elements listed above. For example, alloys of Hf, Ta, W, Ir, Pt, Bi, Cu, Mo, Gd, Ge, Ga, or Au can be used for fabricating the inserts. In some embodiments, the inserts comprise a single element from the list above. In some embodiments, the inserts are a non-magnetic compound. The thickness range for ti insert layer 725 can be 0.1 nm (nanometers) to 7 nm, in accordance with some embodiments.

In the absence of insert layer 725, high DMI is present at the interface of any SOC/SOT electrode and the free layer magnet adjacent to it. Larger DMI means a larger in-plane magnetic field is to be applied to keep the SOT switching efficiently. The insert layer 725 of various embodiments reduces the DMI at the interface of the SOC interconnect 222 and the fee magnet 721aa to allow for efficiency spin orbit coupling or torque transduction at low in-plane fields. Insert layer 725 also acts as a matching layer to reduce the spin memory loss effect. For example, the lattice structure of insert layer 725 matches with the lattice structure of SOC interconnect 222, and this matching reduces the spin memory loss effect.

In some embodiments, SOC interconnect 222 comprises doped AFM. For example, the AFM of interconnect 222 is doped by one of: oxygen, nitrogen or heavy metal with large spin flip length and small thermal mobility such as Ta, Pt, W, Mo, Co, Ni and others. In some embodiments, the AFM of interconnect 22 applies SOT and in-plane exchange bias to the free layer 721aa/421a. In some embodiments, the AFM of interconnect 222 is doped with one of: Co, Fe, Ni, MnGa, MnGeGa, or Bct-Ru. In some embodiments, the doping material can be: IrMn, PtMn, NiMn or other triangular, Kagomi, chiral or hexagonal antiferromagnet and in their single crystal form or their amorphous alloys in various compositions. In some embodiments, the doping can be done by co-sputtering and or reactive ion sputtering in case of oxygen or nitrogen. In some embodiments, the oxygen, fluorine doping can be done by plasma treatments.

In some embodiments, the other free magnet 721ac of the free magnet structure couples to or is adjacent to a dielectric (e.g., when the magnetic junction is an MTJ) or a metal or its oxide (e.g., when the magnetic junction is a spin valve). In some embodiments, the free magnet structure comprises a first free magnet 721aa having perpendicular magnetization that can point substantially along the +z-axis or −z-axis according to an external field (e.g., spin torque, spin coupling, electric field); a coupling layer 721ab; and a second free magnet 721ac having perpendicular magnetization that can point substantially along the +z-axis or −z-axis. In various embodiments, the second free magnet 721ac is adjacent to layer 221b (e.g., dielectric or metal/metal-oxide).

While various embodiments here illustrate the use of the multi-layer free magnet structure being adjacent to the insert layer 725 which is adjacent to a spin Hall effect write electrode 222, the embodiments are applicable to a regular spin transfer torque (SOT) electrode (not shown) which can replace spin Hall effect write electrode 222. The range of thickness for tsoc interconnect 222 is 0.1 nm to 20 nm, in accordance with some embodiments.

In some embodiments, the coupling layer 721ab includes one or more of: Ru, Os, Hs, Fe, or other transition metals from the platinum group of the periodic table. In some embodiments, magnets 721aa, 721ac, and 724 comprise CFGG. In some embodiments, magnets 721aa, 721ac, and 724 are formed from Heusler alloys. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, magnets 721aa and 721ac with PMA comprises a stack of materials, wherein the materials for the stack are selected from a group comprising: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; $Mn_xGa_y$; Materials with $L1_0$ symmetry; or materials with tetragonal crystal structure. In some embodiments, the magnet with PMA is formed of a single layer of one or more materials. In some embodiments, the single layer comprises Mn and Ga (e.g., MnGa).

FIGS. 7C-D illustrate a 3D view 730 and corresponding cross-section view 740, respectively, of a device having a magnetic junction with magnets having perpendicular magnetizations, and an insert layer between the magnetic junction and a composite interconnect having antiferromagnetic (AFM) material, according to some embodiments of the disclosure. The device of FIGS. 7C-D is similar to device of FIGS. 7A-B but for the composition of interconnect 222. Here, interconnect 222 is replaced with a composite interconnect 722, in accordance with some embodiments. The thickness of to is in a range of 0.1 nm to 20 nm, in accordance with some embodiments. In some embodiments, composite interconnect 722 comprises two or more layers of 722a and 722b. In some embodiments, the two or more layers of 722a and 722b includes AFM material. In various embodiments, layer 722a, which is directly in contact with insert layer 725, comprises an AFM material that has the highest spin orbit torque compared to other non 722a layers. In some embodiments, the AFM material of interconnect 722 applies interfacial in-plane exchange bias to free layer 721aa. In some embodiments, AFM material includes one of: Ir, Pt, Mn, Pd, or Fe. In some embodiments, the AFM material is a quasi-two-dimensional triangular AFM including $Ni_{(1-x)}M_xGa_2S_4$, where 'M' includes one of: Mn, Fe, Co or Zn. The thicknesses of ta and tb are in the range of 0.1 nm to 8 nm, in accordance with some embodiments.

FIGS. 7E-F illustrate a 3D view 750 and corresponding cross-section view 760, respectively, of a device having a magnetic junction with magnets having perpendicular magnetizations, and an insert layer between the magnetic junction and the SOC interconnect, and a via comprising an in-plane magnet adjacent to the SOC interconnect, according to some embodiments of the disclosure.

In some embodiments, the device of FIGS. 7E-F includes an in-plane fixed magnet 726 adjacent to one of the surfaces of the interconnect 222/722 such that the insert layer 725 is adjacent to the other surface opposite to the surface of interconnect 222/722. In some embodiments, the in-plane fixed magnet 726 is thick or long enough in dimensions that results in a stable in-plane magnet that applies an effective in-plane field on the perpendicular free magnets 721aa and/or 721ac for faster switching of free magnets 721aa and/or 721ac. The in-plane fixed magnet 726 thickness tm is in the range of 1 nm to 20 nm, in accordance with some embodiments. The effective in-plane field can be applied via exchange bias interaction or dipole coupling from the in-plane fixed magnet 726. For example, in-plane magnet 726 has a magnetization pointing along the x-direction or y-direction and is parallel to the x-y plane of the device 750. Here, the switching speed of the free magnets in the structure is improved for the same power consumption over the switching speed of the free magnet 421a of FIG. 4A.

Figures 7G, 7H:
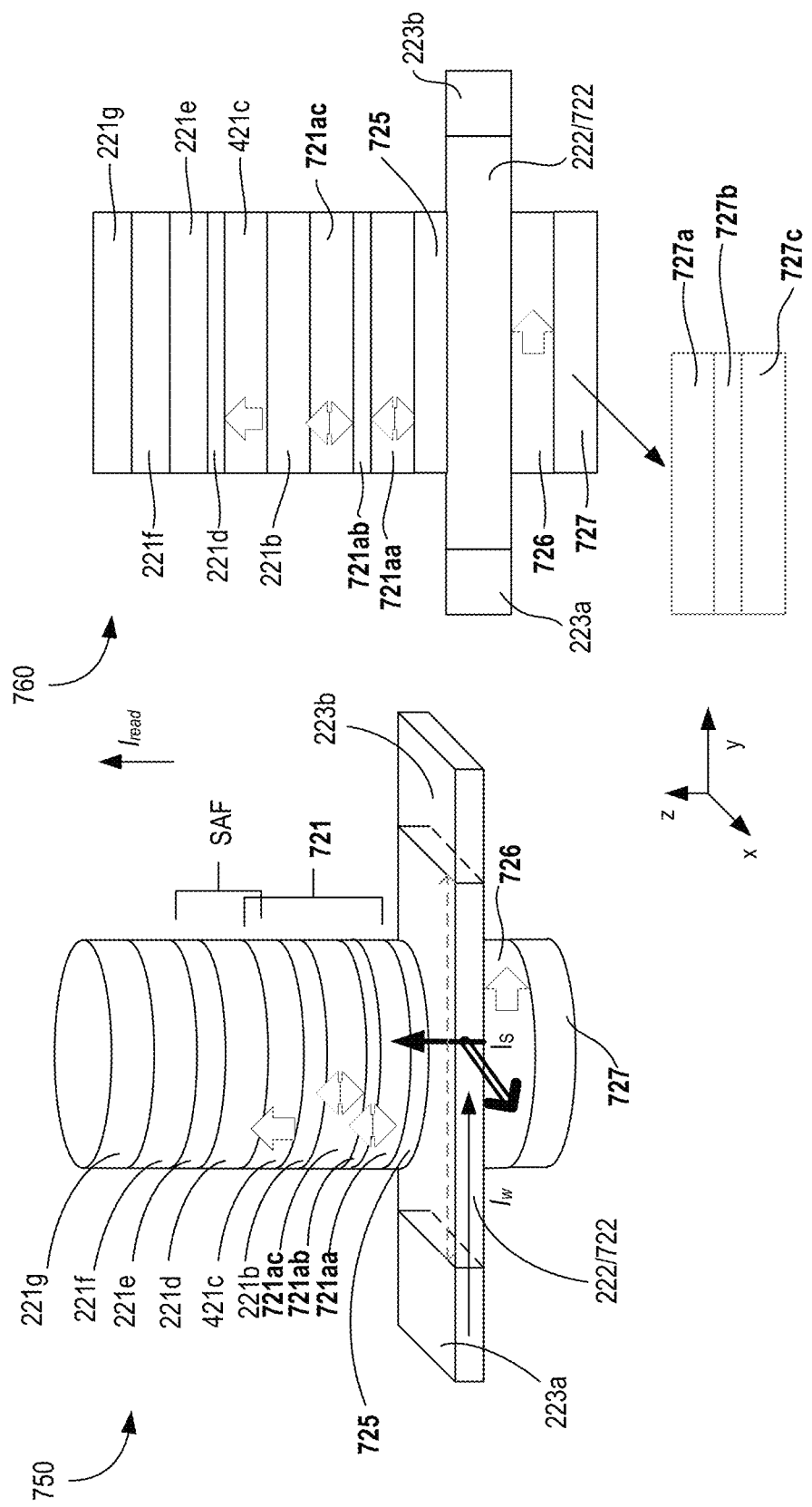
FIGS. 7G-H illustrate a 3D view and corresponding cross-section view, respectively, of a device having a magnetic junction with magnets having perpendicular magnetizations, and an insert layer between the magnetic junction and the SOC interconnect, and a via comprising an in-plane magnet and an AFM one of which is adjacent to the SOC interconnect according to some embodiments of the disclosure.

FIGS. 7G-H illustrate a 3D view 750 and corresponding cross-section view 760, respectively, of a device having a magnetic junction with magnets having perpendicular magnetizations, and an insert layer between the magnetic junction and the SOC interconnect, and a via comprising an in-plane magnet and an AFM one of which is adjacent to the SOC interconnect according to some embodiments of the disclosure.

The device of FIG. 7G is similar to the device of FIG. 7E, but for addition of AFM 727 in the magnetic via. In some embodiments, the in-plane fixed magnet 726 of the magnetic via is coupled to or is adjacent to an in-plane AFM or synthetic AFM (SAF) 727 also formed in the magnetic via. The order of the AFM 727 and in-plane fixed magnet 726 can be switched. For example, in some embodiments, AFM 727 is adjacent to interconnect 222/722 while the in-plane fixed magnet 726 is below AFM 727 and not in direct contact with interconnect 222/722.

In some embodiments, AFM or SAF 727 comprises a material which includes one of: Ir, Pt, Mn, Pd, or Fe. In some embodiments, AFM or SAF 727 is a quasi-two-dimensional triangular AFM including $Ni_{(1-x)}M_xGa_2S_4$, where 'M' includes one of: Mn, Fe, Co or Zn. In some embodiments, AFM or SAF 727 comprises a pair of fixed magnets 727a and 727c with in-plane magnetizations, and a coupling layer 727b between the fixed magnets 727a and 727c. In some embodiments, the materials for the fixed magnets 727a/c can be according to any of the materials for magnets discussed herein. In various embodiments, the fixed magnets 727a/c are in-plane magnets. In some embodiments, the material for coupling layer 727b can be the same material (or selected from the same group of materials) as that of coupling layer 721ab. Technical effect wise, the device of FIG. 7G performs similarly to the device of FIG. 7A and improves switching speed of free magnets 721aa and 721ac relative to switching speed of free magnet 221a.

FIGS. 7I-J illustrate 3D view 770 and corresponding cross-section view 780, respectively, of a device having a magnetic junction with magnets having perpendicular magnetizations, and an insert layer between the magnetic junction and the SOC interconnect, where an AFM is embedded in the SOC interconnect, and a via comprising an in-plane magnet which is adjacent to the AFM, according to some embodiments of the disclosure.

The device of FIG. 7I is similar to the device of FIG. 7G except that the AFM 727 is also incorporated outside the magnetic via as AFM 728 adjacent to SOC interconnect 222. In some embodiments, AFM 728 can behave as an etch stop layer when fabricating SOC interconnect 222. As such, one or more additional processes for forming an etch stop layer is/are removed. In various embodiments, AFM 728 assists with keeping the magnetization of magnet 726 stable with in-plane magnetization. In some embodiments, AFM 728 also comprises a pair of fixed magnets (not shown) with in-plane magnetizations, and a coupling layer between the fixed magnets like AFM 727. Technical effect wise, the device of FIG. 7I performs similarly to the devices of FIG. 7G and improves switching speed of free magnets 721aa and 721ac relative to the switching speed of free magnet 221a by SHE electrode 222 alone.

Figure 8A:
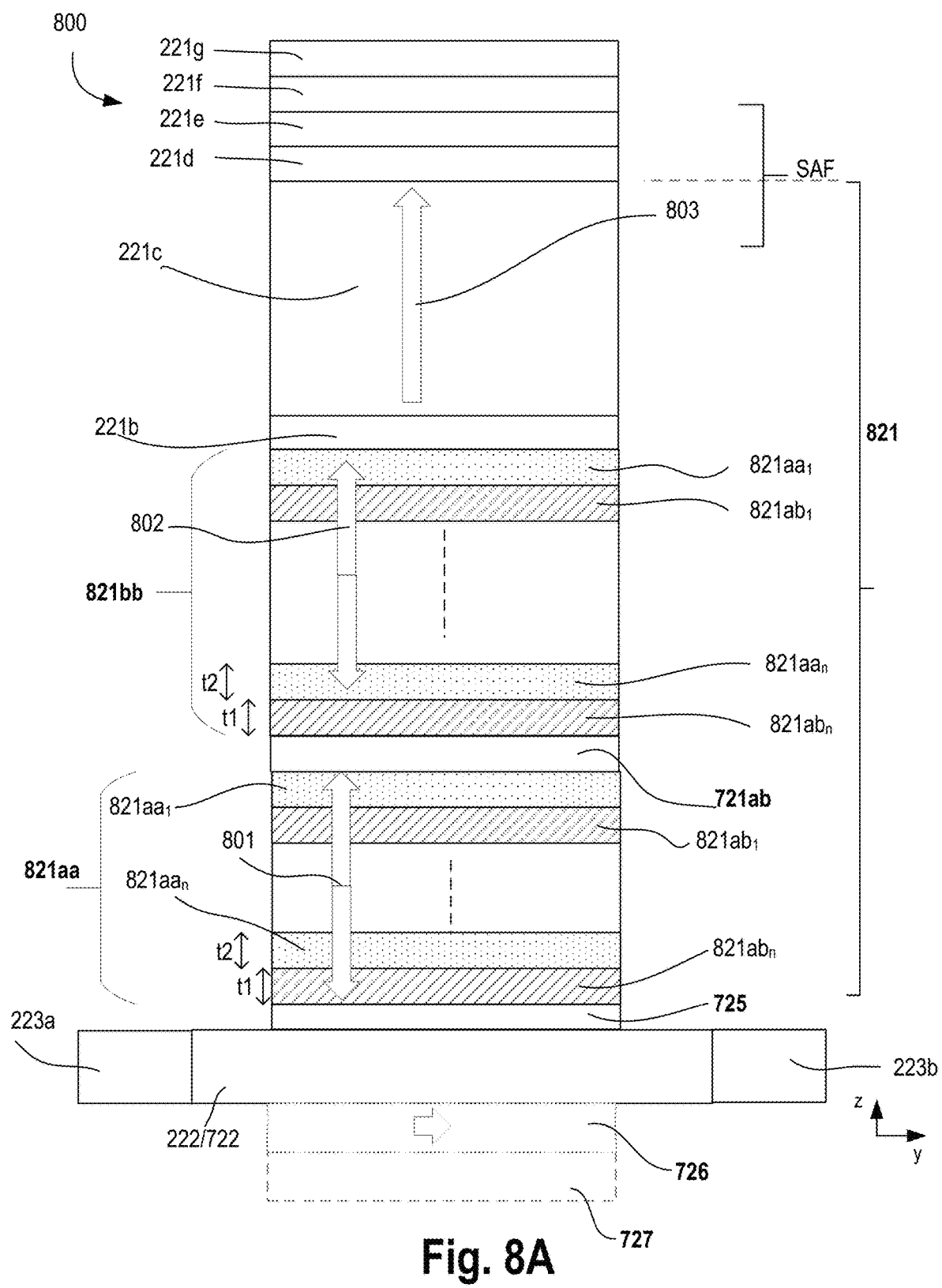
FIG. 8A illustrates a cross-section of a device having a magnetic junction with magnets having perpendicular magnetizations, where a free magnet structure of the magnetic junction comprises a stack of magnets with perpendicular magnetizations, and a via comprising an in-plane magnet and/or an AFM one of which is adjacent to the SOC interconnect, and an insert layer between the magnetic junction and the interconnect, according to some embodiments of the disclosure.

FIG. 8A illustrates a cross-section of a device 800 having a magnetic junction with magnets having perpendicular magnetizations, where a free magnet structure of the magnetic junction comprises a stack of magnets with perpendicular magnetizations 801, 802, and 803, and a via comprising an in-plane magnet and/or an AFM one of which is adjacent to the SOC interconnect, and an insert layer between the magnetic junction and the interconnect, according to some embodiments of the disclosure.

The magnetic junction here is illustrated by reference sign 821 where the layers under layer 221b (e.g., dielectric or metal/metal-oxide) together form the structure comprising the free magnet of the junction. The device of FIG. 8A is similar to the device of FIG. 7A except that the free magnets 721aa and 721ae are replaced with composite magnets having multiple layers.

In some embodiments, the composite stack of multi-layer free magnet 821aa includes 'n' layers of first material and second material. For example, the composite stack comprises layers 821aa$_{1-n}$ and 821ab$_{1-n}$ stacked in an alternating manner, where 'n' has a range of 1 to 10. In some embodiments, the first material includes one of: Co, Ni, Fe, or an Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect. In various embodiments, free magnet structure 821aa is coupled to interconnect 222/722 via insert layer 725.

In some embodiments, composite stack of multi-layer free magnet 821bb includes 'n' layers of first material and second material. For example, the composite stack comprises layers 821aa$_{1-n}$ and 821ab$_{1-n}$ stacked in an alternating manner, where 'n' has a range of 1 to 10. In some embodiments, the first material includes one of: Co, Ni, Fe, or a Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t1 in a range of 0.6 nm to 2 nm. In some embodiments, the second material has a thickness t2 in a range of 0.1 nm to 3 nm. While the embodiments here show first material being at the bottom followed by the second material, the order can be reversed without changing the technical effect.

The embodiments of FIGS. 7A-J can be mixed in any order. For example, the in-plane magnet 726 can be replaced with an AFM magnet, free magnet structure with free magnets and coupling layer can be replaced with a single magnet with free magnetization, etc. In some embodiments, the magnets (free and/or fixed) can also be paramagnets.

Figure 8B:
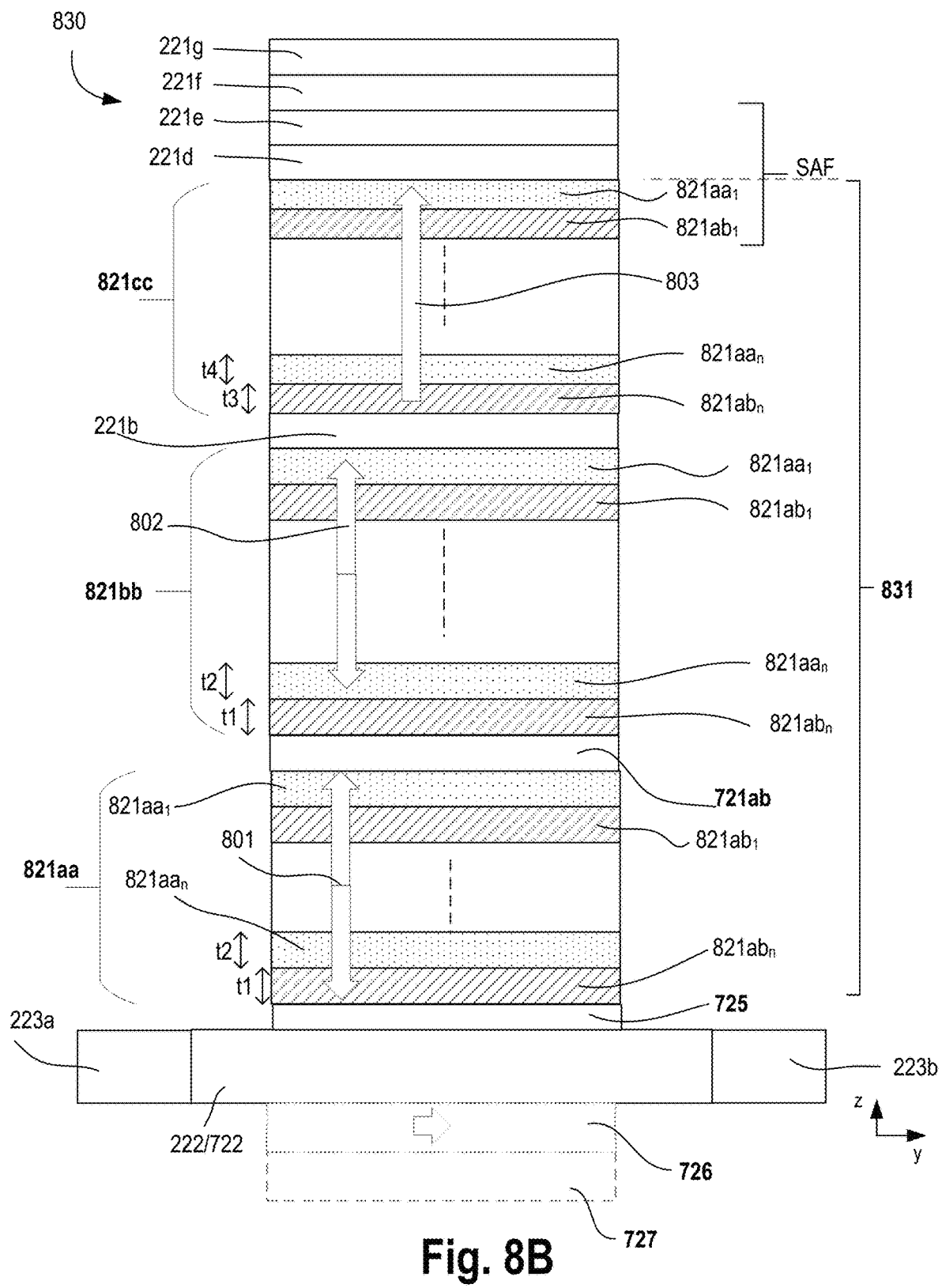
FIG. 8B illustrates a cross-section of a device having a magnetic junction with magnets having perpendicular magnetizations, where a free magnet structure and a fixed magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure.

FIG. 8B illustrates a cross-section of a device 830 having a magnetic junction with magnets having perpendicular magnetizations, where a free magnet structure and a fixed magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure.

Here, fixed magnet 221c of FIG. 8A is replaced with a composite stack. As such, the magnetic junction is labeled as 831. In some embodiments, composite stack of multi-layer fixed magnet 821cc includes 'n' layers of first material and second material. For example, the composite stack comprises layers 821$aa_{1-n}$ and 821$ab_{1-n}$ stacked in an alternating manner, where 'n' has a range of 1 to 10. In some embodiments, the first material includes one of: Co, Ni, Fe, or Heusler alloy. In some embodiments, the second material includes one of: Pt, Pd, Ir, Ru, or Ni. In some embodiments, the Heusler alloy includes one or more of Co, Cu, Fe, Ga, Ge, In, Mn, Al, In, Sb, Si, Sn, Ni, Pd, Ru, or V. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu. In some embodiments, the first material has a thickness t3 in a range of 0.6 nm to 2 nm. In some embodiments, the second material has a thickness t4 in a range of 0.1 nm to 3 nm. While the embodiments here show the first material being at the bottom followed by the second material, the order can be reversed without changing the technical effect.

Figure 8C:
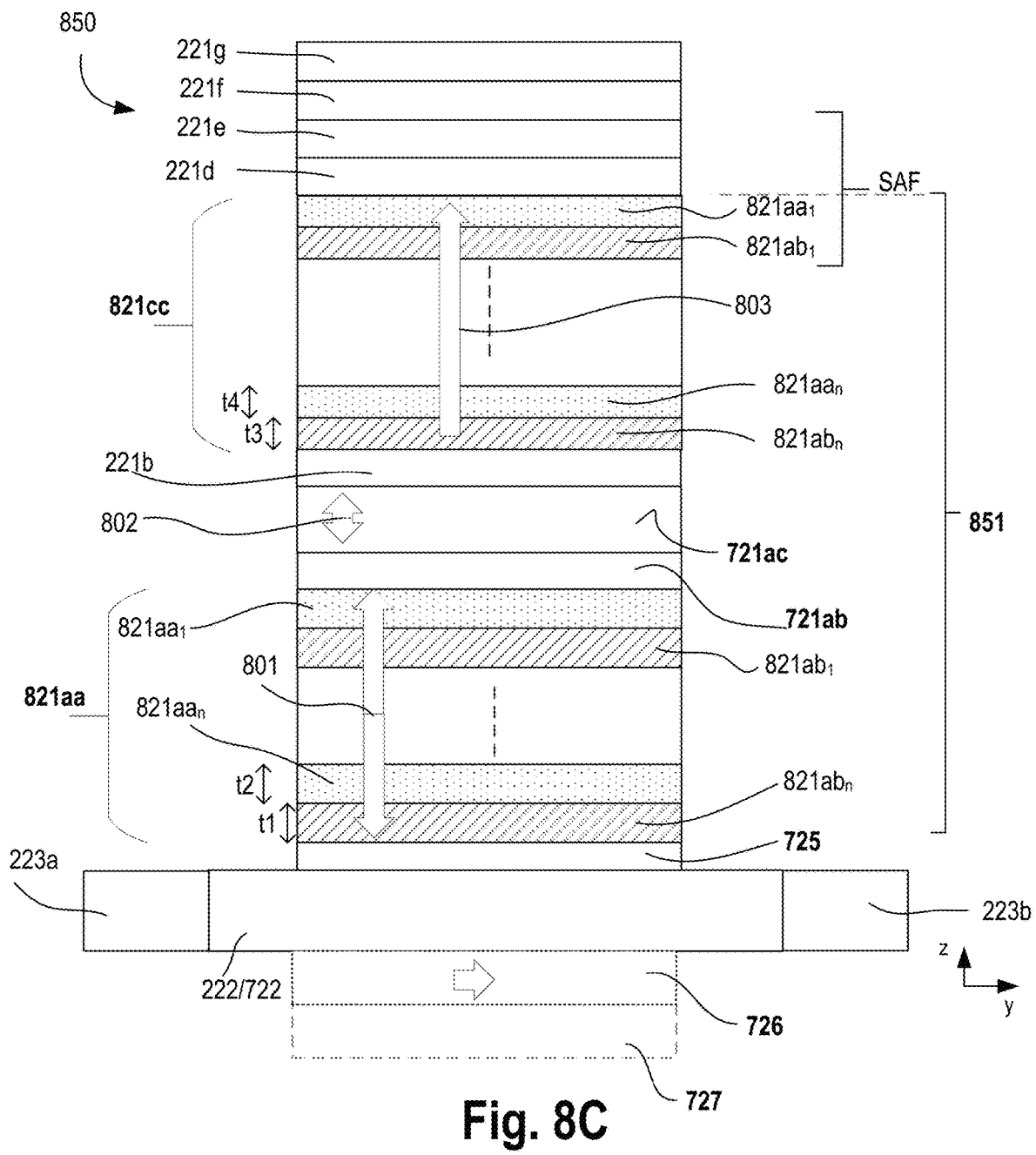
FIG. 8C illustrates a cross-section of a device having a magnetic junction with magnets having perpendicular magnetizations, where a fixed magnet structure and one of the free magnets of a free magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure.

FIG. 8C illustrates a cross-section of a device 850 having a magnetic junction with magnets having perpendicular magnetizations, where a fixed magnet structure and one of the free magnets of a free magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure. Here, free magnet 821bb of FIG. 8C is replaced with a non-composite free magnet 721ac. As such, the magnetic junction is labeled as 851.

Figure 8D:
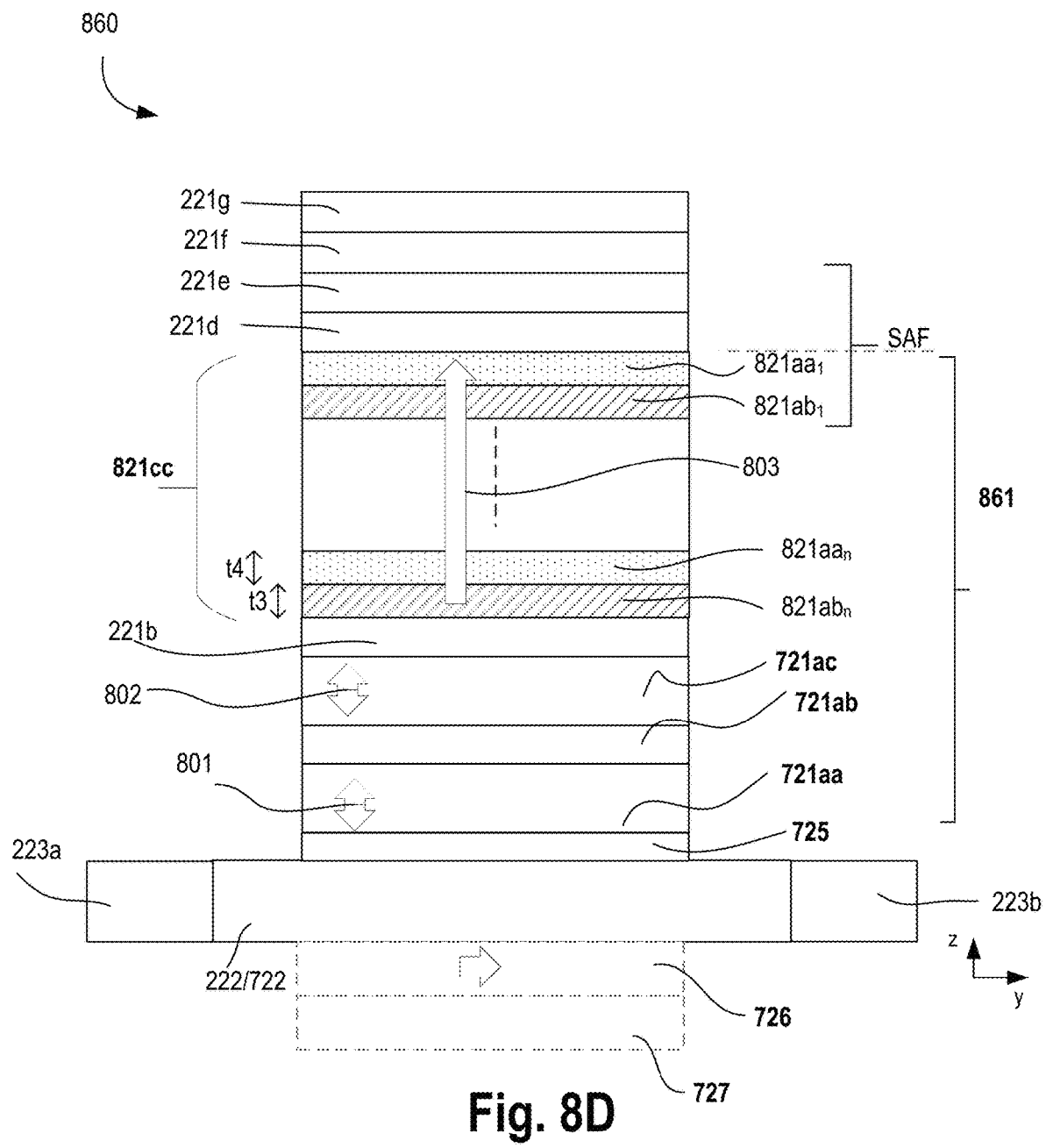
FIG. 8D illustrates a cross-section of a device having a magnetic junction with magnets having perpendicular magnetizations, where a fixed magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure.

FIG. 8D illustrates a cross-section of a device 860 having a magnetic junction with magnets having perpendicular magnetizations, where a fixed magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure. Here, free magnet 821aa of FIG. 8D is replaced with a non-composite free magnet 721aa. As such, the magnetic junction is labeled as 861.

Figure 8E:
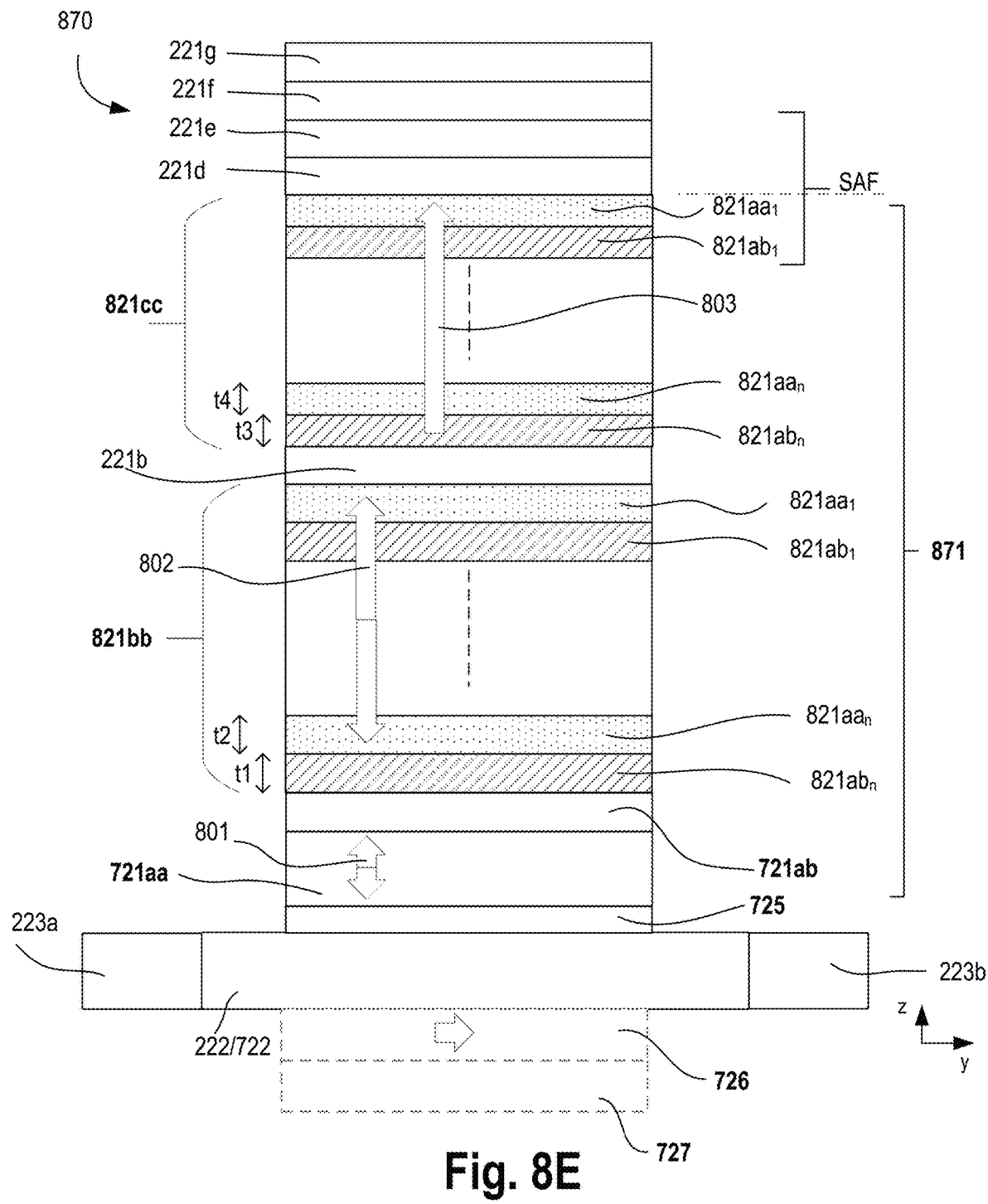
FIG. 8E illustrates a cross-section of a device having a magnetic junction with magnets having perpendicular magnetizations, where a fixed magnet structure and one of the free magnets of a free magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure.

FIG. 8E illustrates a cross-section of a device 870 having a magnetic junction with magnets having perpendicular magnetizations, where a fixed magnet structure and one of the free magnets of a free magnet structure of the magnetic junction comprises a stack of magnets with perpendicular magnetizations, and a via comprising an in-plane magnet and/or an AFM, one of which is adjacent to the SOC interconnect, and an insert layer between the magnetic junction and the interconnect, according to some embodiments of the disclosure. Here, free magnet 821aa of FIG. 8B is replaced with a non-composite free magnet 721aa.

Figure 8F:
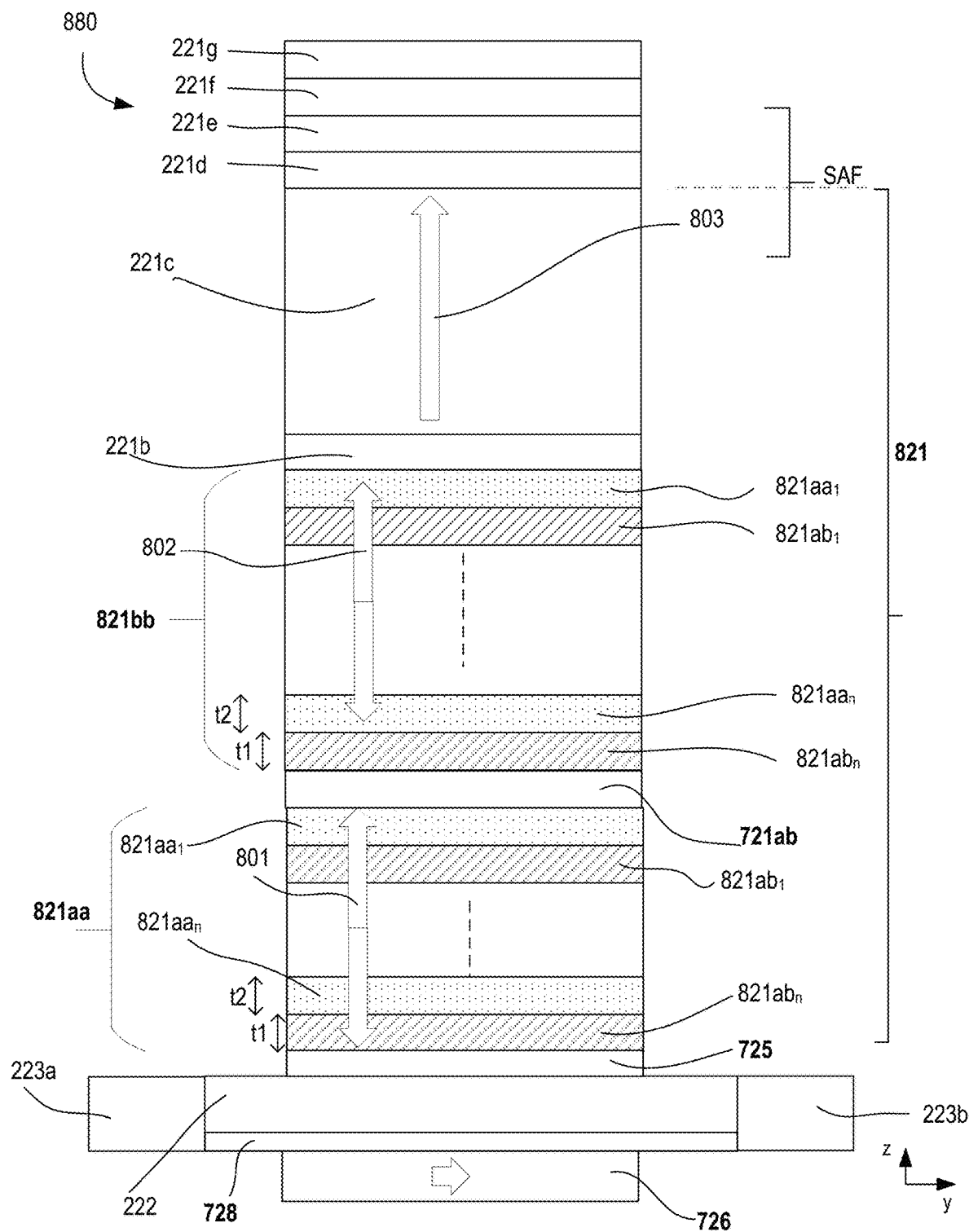
FIG. 8F illustrates a cross-section of a device having a magnetic junction with magnets having perpendicular magnetizations, where a free magnet structure and a fixed magnet structure of the magnetic junction comprises a stack of magnets with perpendicular magnetizations, and a via comprising an in-plane magnet which is adjacent to an AFM embedded in the SOC interconnect, and an insert layer between the magnetic junction and the interconnect, according to some embodiments of the disclosure.

FIG. 8F illustrates a cross-section of a device 880 having a magnetic junction with magnets having perpendicular magnetizations, where a free magnet structure and a fixed magnet structure of the magnetic junction comprises a stack of magnets with perpendicular magnetizations, and a via comprising an in-plane magnet which is adjacent to an AFM embedded in the SOC interconnect, and an insert layer between the magnetic junction and the interconnect, according to some embodiments of the disclosure. Compared to FIG. 8F here, the AFM 727 is removed from the magnetic via and integrated in the SOC interconnect 222 as layer 728.

FIG. 9A illustrates plot 900 showing spin polarization capturing switching of a free magnet structure which is exchanged coupled or biased by a magnetic via under an SOC interconnect, and an insert layer between the magnetic junction and the interconnect, according to some embodiments of the disclosure. FIG. 9B illustrates a magnetization plot 920 associated with FIG. 9A, according to some embodiments of the disclosure.

Plot 900 shows switching of the spin orbit torque device with PMA. Here, waveforms 901, 902, and 903 represent the magnetization projections on the x, y, and z axes, respectively. The magnet starts with z-magnetization of −1. Positive spin orbit torque (SOT) is applied from 5 ns (nanoseconds) to 50 ns. It leads to switching the z-magnetization to 1. Then, a negative spin orbit torque is applied between 120 ns and 160 ns. It leads to switching the z-magnetization to 1. This illustrates change of magnetization in response to write charge current of certain polarity.

FIG. 9C illustrates a plot 930 showing spin polarization capturing switching of the free magnet structure which is exchanged coupled or biased by a magnetic via under an SOC interconnect, and an insert layer between the magnetic junction and the interconnect, according to some embodiments of the disclosure. FIG. 9D illustrates a magnetization plot 940 associated with FIG. 9C, according to some embodiments of the disclosure.

Here, waveforms 931, 932, and 933 represent the magnetization projections on x, y, and z axes, respectively. The difference from the case of FIG. 9C is that negative spin orbit torque (SOT) is applied from 5 ns to 50 ns. As a result, the z-magnetization remains close to −1. This illustrates the persistence of magnetization in response to write charge current of opposite polarity.

Figure 10A:
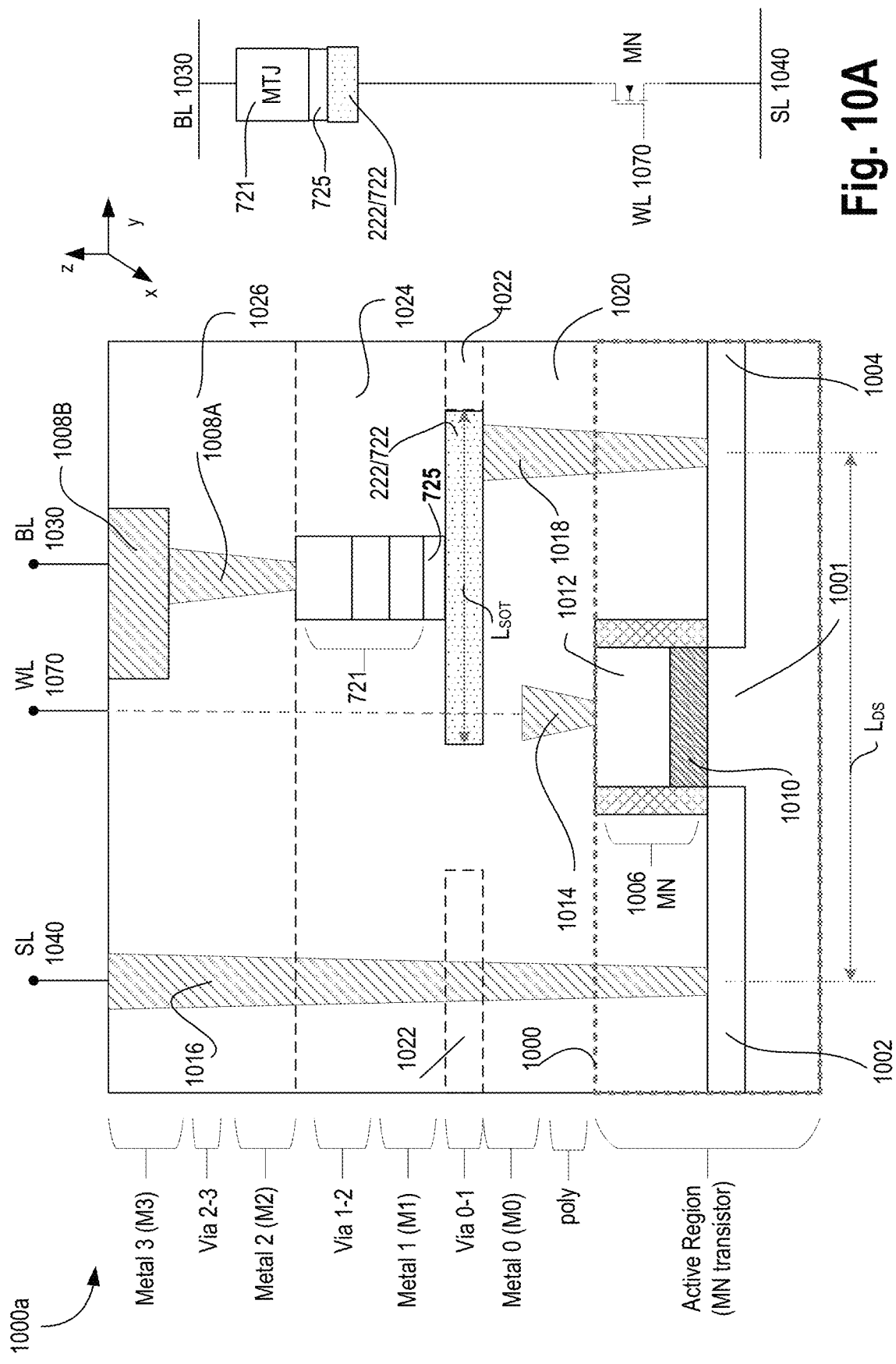
FIG. 10A-C illustrates a cross-sectional view of a SOT memory device (e.g., any one of devices of FIGS. 7-8) coupled to a first transistor and a bit line, according to some embodiments.
Figure 10B:
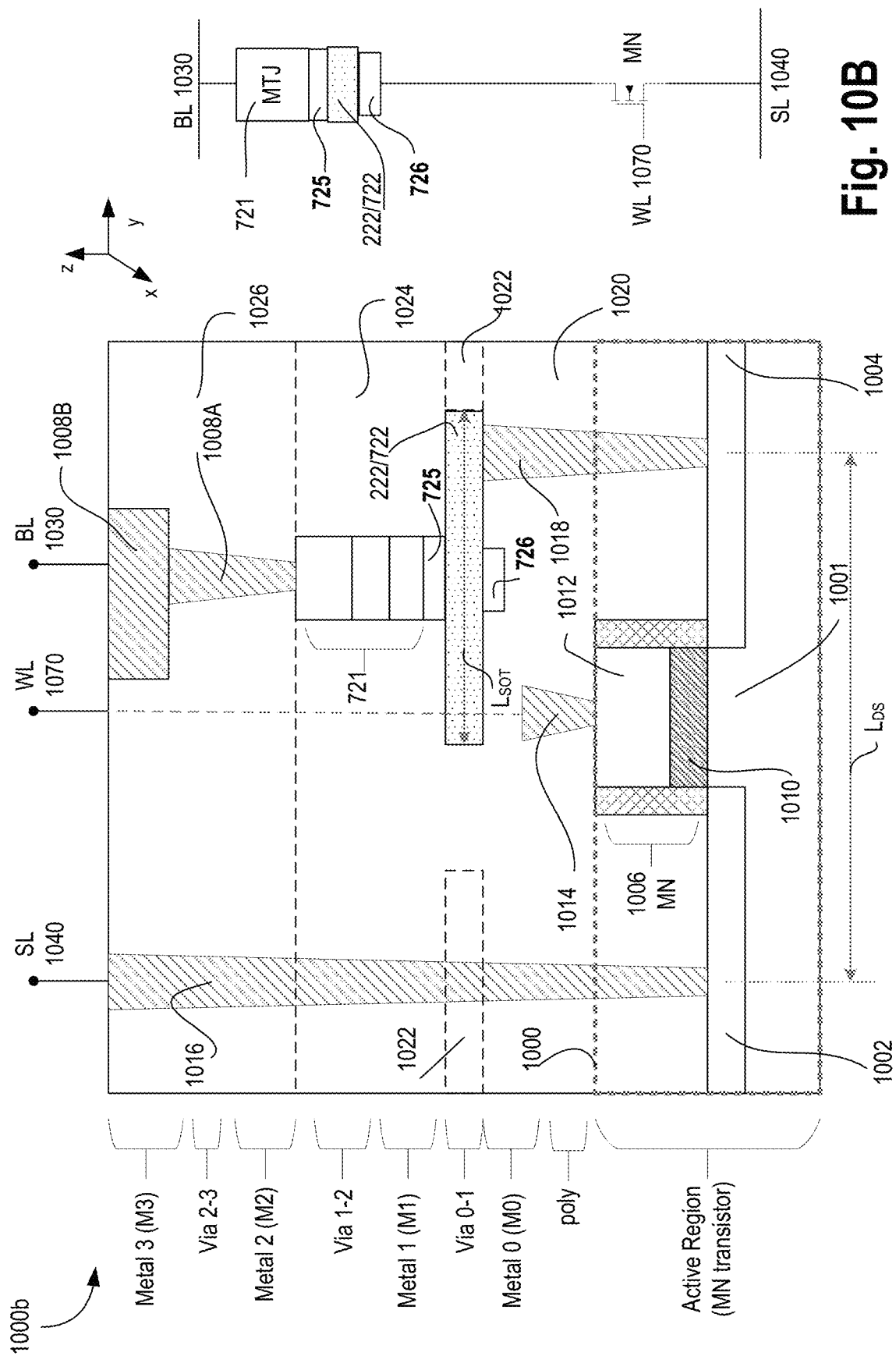
Figure 10C:
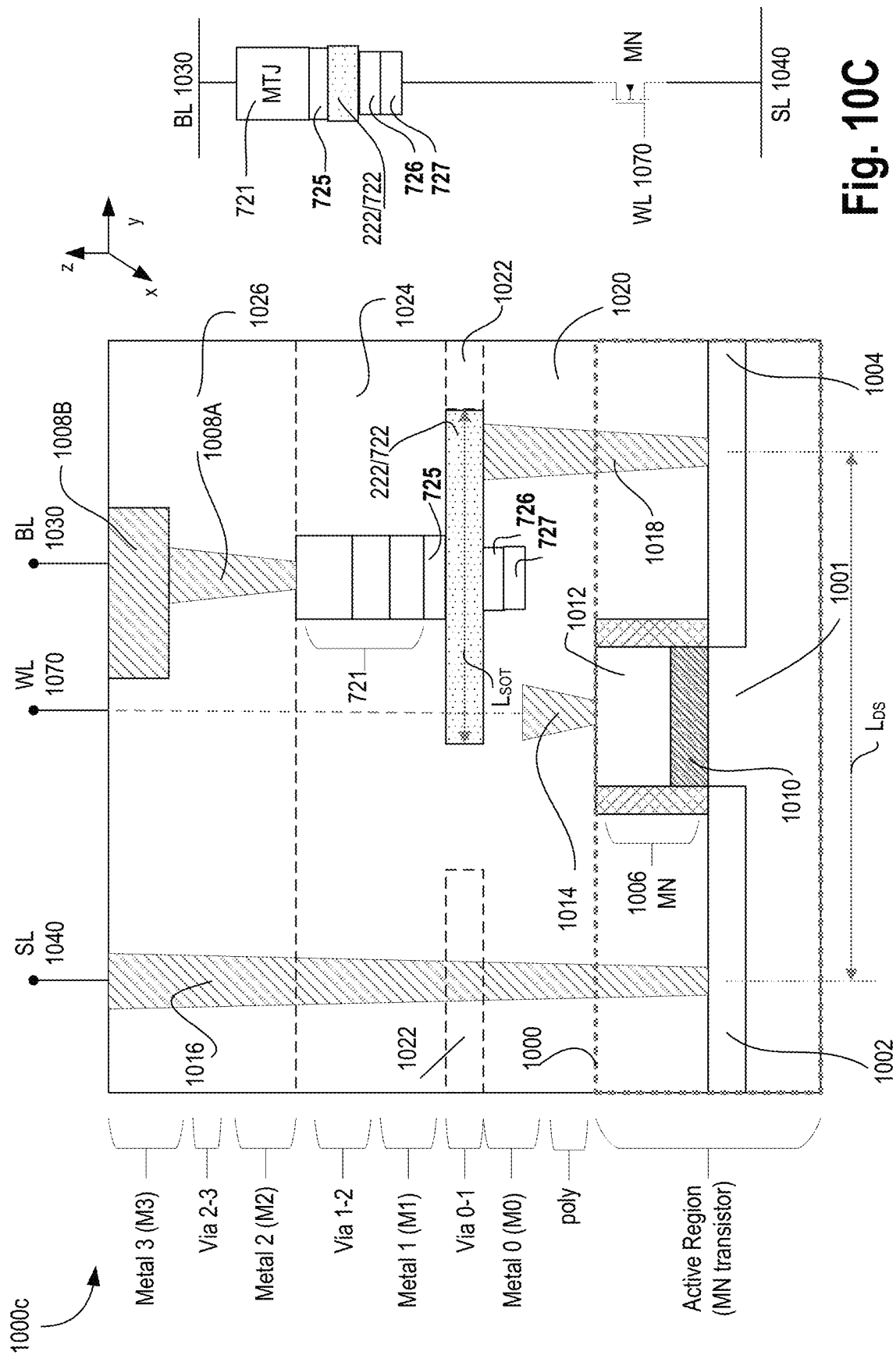

FIGS. 10A-C illustrate a cross-sectional view of a SOT memory device 1000a, 1000b, and 1000c, respectively, (e.g., any one of devices of FIGS. 7-8) coupled to a transistor and a bit line, according to some embodiments.

In an embodiment, the transistor is an n-type transistor MN that has a source region 1002, a drain region 1004 and a gate 1006. The transistor MN further includes a gate contact 1014 disposed above and electrically coupled to the gate 1006, a source contact 1016 disposed above and electrically coupled to the source region 1002, and a drain contact 718 disposed above and electrically coupled to the drain region 1004. In some embodiments, an SOT memory device such as a SOT memory device of FIGS. 7-8 is disposed above the transistor. While the embodiments are illustrated with an n-type transistor MN, the transistor can be replaced with a p-type transistor.

In some embodiments, the SOT memory device includes a spin orbit torque electrode, such as spin orbit torque electrode 222/722, a magnetic tunnel junction memory device such as MTJ 721/821/831/841/851/861/871 disposed on the spin orbit torque electrode 222, and a conductive interconnect structure such as conductive interconnect structure 708 (e.g., structure 708a/b) disposed on and coupled to the MTJ 221/321/421. In some embodiments, the spin orbit torque electrode 222 is disposed on the drain contact 718 of the transistor 700.

In some embodiments, the MTJ memory device (e.g., which includes MTJ 721/821/831/841/851/861/871) includes individual functional layers that are described in association with FIGS. 2-8. In some embodiments, the spin orbit torque electrode 222 has a length, $L_{SOT}$ That is less than a distance of separation, $L_{DS}$ between the drain contact 1018 and the source contact 1016. In some embodiments, a portion of the spin orbit torque electrode 222 extends above the gate electrode 1012 and the gate contact 1014. In some embodiments, a portion of the spin orbit torque electrode 222 extends over the gate electrode 1012. In some embodiments, the spin orbit torque electrode 222 is in a first y-z plane as illustrated in FIG. 7A.

In some embodiments, the gate contact 1014 is directly below the spin orbit torque electrode 222. In some embodiments, a word-line (WL) contact 1070 is disposed onto the gate contact 1014 on a second y-z plane behind (into the page) the first y-z plane of the spin orbit torque electrode 222. In some embodiments, the spin orbit torque electrode 222 that may not contact the word-line contact is disposed on the gate electrode 1012.

In some embodiments, the transistor MN associated with substrate 1001 is a metal-oxide-semiconductor field-effect transistor (MOSFET or simply MOS transistors), fabricated on the substrate 1001. In various embodiments of the present disclosure, the transistor may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor is a tri-gate transistor.

In some embodiments, a voltage $V_{DS}$ is applied between the bit-line (BL) 1030 and the source-line (SL) 1040 and a word-line 1050 is energized above a threshold voltage, $V_{TH}$ on the transistor. In some embodiments, an electron current (spin hall current) flows through the spin orbit torque electrode 222 and causes a spin diffusion current to flow toward the MTJ memory device 200/300/400. The spin diffusion current exerts a torque on the magnetization of the free magnet 721aa/821aa of MTJ 721/821/831/841/851/861/871.

In some embodiments, by applying a voltage $V_{DS}$ between bit-line 1030 and source-line 1040, current can flow through the MTJ memory device of FIGS. 7-8. In some embodiments, a voltage $V_{DS}$ that is equal to or greater than the threshold voltage $V_{TS}$ is enough to generate spin polarized current through the MTJ 721/821/831/841/851/861/871. In some embodiments, the spin transfer torque current flowing through the MTJ 221/321/421 also imparts torque to the free magnet 421a/721aa//821aa adding to the torque from the spin diffusion current. In some embodiments, the combined effect of the spin transfer torque and the spin diffusion torque can switch the magnetization of the free magnet 421a/721aa//821aa. In some embodiments, by reversing the polarity of the voltage Vim, and applying a voltage that meets or exceeds a threshold voltage, the direction of magnetization of the free magnet 421a/721aa//821aa is switched back to a previous configuration.

In some embodiments, by applying a voltage between a bit-line 1030 and source-line 1040, and by applying a voltage above a threshold voltage, $V_{TH}$ on the word-line 1050 of the transistor, the MTJ memory device FIGS. 7-8 can undergo magnetization switching without the need for an additional voltage source (e.g. a second transistor). In some embodiments, implementing an SOT memory device FIGS. 7-8 above a transistor can increase the number of SOT memory devices FIGS. 7-8 in a given area of a die by at least a factor of two.

In some embodiments, the underlying substrate 1001 represents a surface used to manufacture integrated circuits. In some embodiments, the substrate 1001 includes a suitable semiconductor material such as but not limited to, single crystal silicon, polycrystalline silicon and silicon on insulator (SOI). In another embodiment, the substrate 1001 includes other semiconductor materials such as germanium, silicon germanium, or a suitable group III-V or group III-N compound. The substrate 1001 may also include semiconductor materials, metals, dopants, and other materials commonly found in semiconductor substrates.

In some embodiments, the transistor includes a gate stack formed of at least two layers, a gate dielectric layer 1010 and a gate electrode layer 1012. The gate dielectric layer 1010 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1010 to improve its quality when a high-k material is used.

The gate electrode layer 1012 of the transistor 700 is formed on the gate dielectric layer 1010 and may comprise of at least one P-type work-function metal or N-type work-function metal, depending on whether the transistor is to be a PMOS or an NMOS transistor. In some embodiments, the gate electrode layer 1012 may comprise of a stack of two or more metal layers, where one or more metal layers are work-function metal layers and at least one metal layer is a conductive fill layer.

For a PMOS transistor, metals that may be used for the gate electrode layer 1012 include, but are not limited to, ruthenium, palladium, platinum, cobalt, nickel, and conductive metal oxides, e.g., ruthenium oxide. A P-type metal layer will enable the formation of a PMOS gate electrode layer 1012 with a work-function that is between about 4.9 eV and about 5.2 eV. For an NMOS transistor, metals that may be used for the gate electrode layer 1012 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 1012 with a work-function that is between about 3.9 eV and about 4.2 eV.

In some embodiments, the gate electrode layer 1012 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 1012 may simply be a planar layer that is substantially parallel to the top surface of the substrate and does not include sidewall portions substantially perpendicular to the top surface of the substrate. In some embodiments of the present disclosure, the gate electrode layer 1012 may comprise of a combination of U-shaped structures and planar, non-U-shaped structures. For example, the gate electrode layer 1012 may comprise of one or more U-shaped metal layers formed atop one or more planar, non-U-shaped layers.

In some embodiments, a pair of gate dielectric layer 1010 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 1002 and drain region 1004 are formed within the substrate adjacent to the gate stack of the transistor. The source region 1002 and drain region 1004 are generally formed using either an implantation/diffusion process or an etching/deposition process. In the former process, dopants such as boron, aluminum, antimony, phosphorous, or arsenic may be ion-implanted into the substrate to form the source region 1002 and drain region 1004. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 1002 and drain region 1004. In some embodiments, the source region 1002 and drain region 1004 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 1002 and drain region 1004 may be formed using one or more alternate semiconductor materials such as germanium or a suitable group III-V compound. In some embodiments, one or more layers of metal and/or metal alloys may be used to form the source region 1002 and drain region 1004.

In some embodiments, the gate contact 1014 and drain contact 1018 of the transistor 700 are disposed in a first dielectric layer 1020 disposed above the substrate 1001. In some embodiments, the spin orbit torque electrode 222 is disposed in a second dielectric layer 1022 disposed on the first dielectric layer 1020. In some embodiments, a third dielectric layer 1024 is disposed on the second dielectric layer 1022. In some embodiments, a fourth dielectric layer 1026 is disposed on the third dielectric layer 1024. In some embodiments, a source contact 1016 is partially disposed in the fourth dielectric layer 1026, partially disposed in the third dielectric layer 1024, partially disposed in the second dielectric layer 1022 and partially disposed on the first dielectric layer 1020. In some embodiments, the spin orbit torque electrode contact is disposed in the third dielectric layer 1024 on the spin orbit torque electrode 222. In some embodiments, the conductive interconnect structure such as conductive interconnect structure 1008A/B disposed in the fourth dielectric layer 1026.

The gate contract 1014 is formed in poly region; drain contract 1018 is formed in active, poly, and Metal 0 (MO); SOT or SHE electrode 222 is formed in Via 0-1 layer; MTJ MTJ 721/821/831/841/851/861/871 is formed in Metal 1 (M1) and Via 1-2; contract 708a is formed in Metal 2 (M2) and Via 2-3; and conductor 1008B is formed in Metal 3 (M3).

In some embodiments, the magnetic junction (e.g., MTJ 721/821/831/841/851/861/871 or spin valve) is formed in the metal 3 (M3) region. In some embodiments, the free magnet layer 421a of the magnetic junction 721/821/831/841/851/861/871 couples to spin Hall electrode 222. In some embodiments, the fixed magnet layer 421c/821cc of magnetic junction 721/821/831/841/851/861/871 couples to the bit-line (BL) via spin Hall electrode 222 through Via 3-4 (e.g., via connecting metal 4 region to metal 4 (M4)). In this example embodiments, the bit-line is formed on M4.

In some embodiments, an n-type transistor MN is formed in the frontend of the die while the spin Hall electrode 222 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the spin Hall electrode 222 is located in the backend metal layers or via layers for example in Via 3. In some embodiments, the electrical connectivity to the device is obtained in layers MO and M4 or M1 and M5 or any set of two parallel interconnects. In some embodiments, the MTJ 721/821/831/841/851/861/871 is formed in metal 2 (M2) and metal 1 (M1) layer region and/or Via 1-2 region. In some embodiments, the spin Hall electrode 222 is formed in the metal 1 region.

Figure 11:
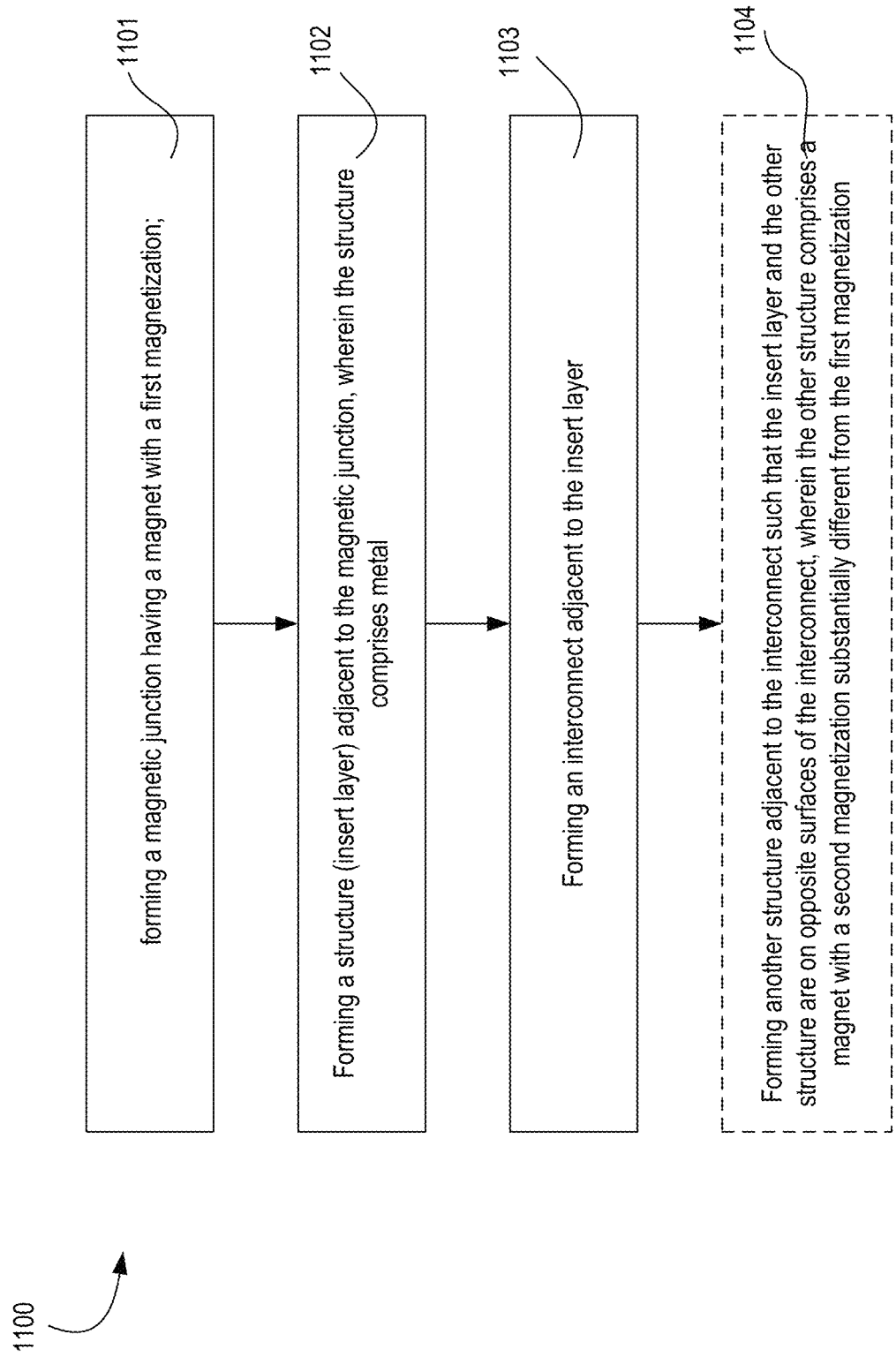
FIG. 11 illustrates a flowchart of a method for forming a device of FIGS. 7-8, in accordance with some embodiments.
Figure 12:
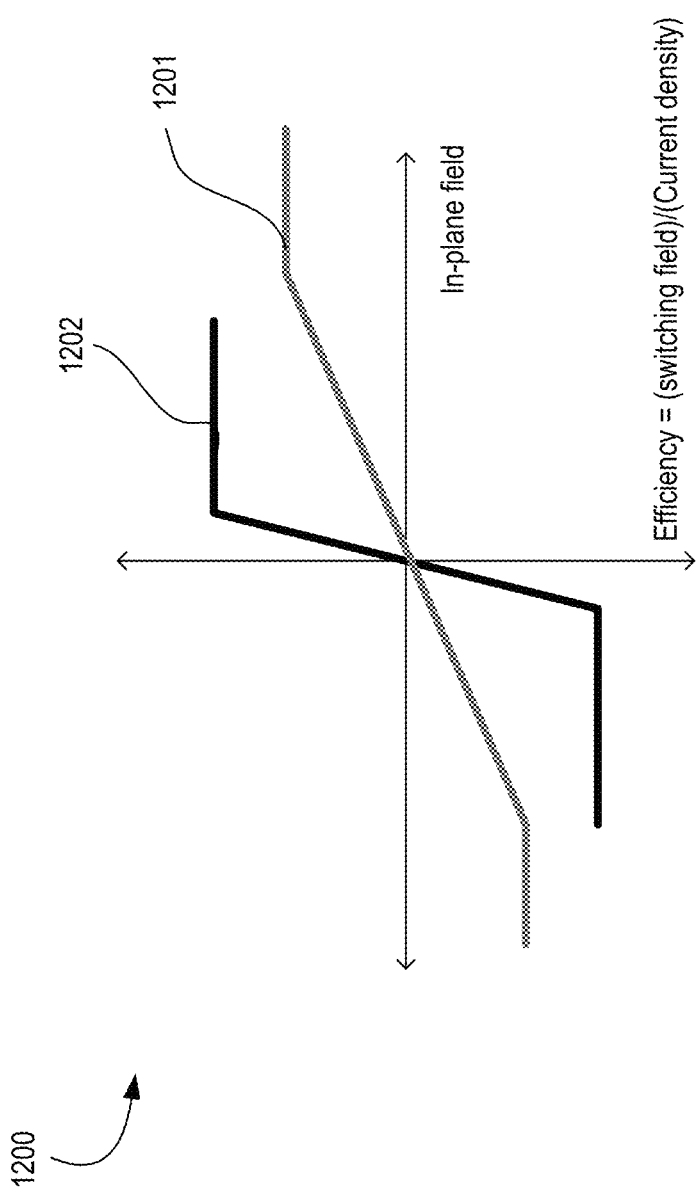
FIG. 12 illustrates a plot showing improvement in switching efficiency due to insert between the SOC interconnect and the magnetic junction.

FIG. 11 illustrates a flowchart 1100 of a method for forming a device of FIGS. 7-8, in accordance with some embodiments. While the following blocks (or process operations) in the flowchart are arranged in a certain order, the order can be changed. In some embodiments, some blocks can be executed in parallel. At block 1101, a magnetic junction is formed having a magnet with a first magnetization (e.g., perpendicular magnetizations). At block 1102, a first structure is formed (e.g., insert layer 725) adjacent to the magnetic junction. At block 1103, an interconnect (e.g., 222/722 or combination of 222 and 728) is formed adjacent to the first structure. In some embodiments, at block 1104, a second structure (e.g., a magnetic via) is formed adjacent to the interconnect such that the first structure and the second structure are on opposite surfaces of the interconnect, wherein the second structure comprises a magnet with a second magnetization substantially different from the first magnetization. For example, the magnet of the second structure has in=plane magnetization FIG. 12 illustrates plot 1200 showing improvement in switching efficiency due to insert between the SOC interconnect and the magnetic junction. Here, x-axis is in-place field in the SOT interconnect 222/722, while the y-axis is efficiency (e.g., switching field/current density). Plot 1200 shows waveform 1201 without insert 725 and the associated efficiency, and waveform 1202 with insert 725 and the associated efficiency. Plot 1200 shows that with insert 725, and with the same in-plane field, the efficiency is higher than the magnetic memory without insert 725.

Figure 13:
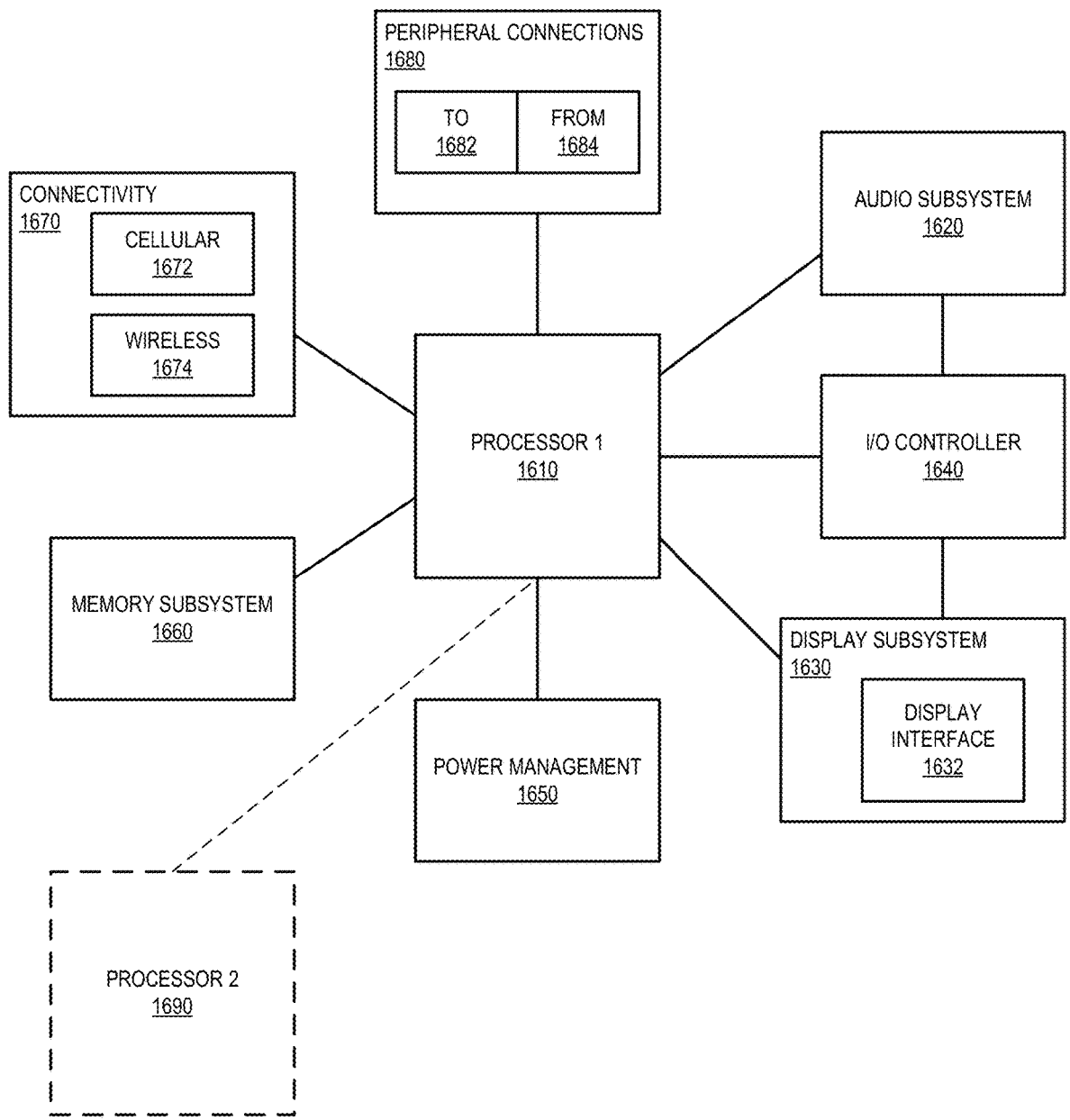
FIG. 13 illustrates a smart device or a computer system or a SoC (System-on-Chip) with a magnetic junction based memory having a via for dipole and exchange coupling in the SOC interconnect, and an insert layer between the magnetic junction and the interconnect, according to some embodiments of the disclosure.

FIG. 13 illustrates a smart device or a computer system or a SoC (System-on-Chip) with a magnetic junction based memory having a via for dipole and exchange coupling in the SOC interconnect, and an insert layer between the magnetic junction and the interconnect, according to some embodiments of the disclosure.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 13 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with one or more devices according to any one of devices of FIGS. 7-8, according to some embodiments discussed. Other blocks of the computing device 1600 may also include one or more devices according to any one of devices of FIGS. 7-8, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a magnetic junction comprising:
     a first structure comprising a magnet with unfixed perpendicular magnetic anisotropy (PMA) relative to an x-y plane of the apparatus;
     a second structure comprising one of a dielectric or a metal; and
     a third structure comprising a magnet with fixed PMA, wherein the third structure has an anisotropy axis perpendicular to the x-y plane of the apparatus, and wherein the third structure is adjacent to the second structure such that the second structure is between the first and third structures;
   a fourth structure adjacent to the first structure of the magnetic junction, wherein the fourth structure comprises one or more of Hf, Ta, W, Ir, Pt, Bi, Cu, Mo, Gd, Ge, Ga, or Au; and
   an electrode comprising a spin Hall effect (SHE) or spin orbit torque (SOT) material adjacent to the fourth structure such that the fourth structure is between the magnetic junction and the electrode, wherein the fourth structure is on the electrode, the electrode comprises a stack of layers, and one of the layers in the stack comprises an antiferromagnetic (AFM) material comprising a quasi-two-dimensional triangular AFM comprising $Ni_{(1-x)}M_xGa_2S_4$, where 'M' comprises one or more of Mn, Fe, Co or Zn.

2. The apparatus of claim 1, further comprising a fifth structure adjacent to the electrode such that the fourth and fifth structures are on opposite surfaces of the electrode, wherein the fifth structure comprises a magnet with in-plane magnetization relative to the x-y plane of the apparatus.

3. The apparatus of claim 1, wherein the magnetic junction comprises:
a fifth structure between the first and second structures or between the second and third structures, wherein the fifth structure comprises one or more of: Ru, Os, Hs, or Fe.

4. The apparatus of claim 1, wherein:
the first structure or the third structure comprises a stack comprising a first material and a second material different from the first material;
the first material comprises one or more of Co, Ni, Fe, or a Heusler alloy;
the Heusler alloy comprises one or more of Co, Cu, Fe, Ga, Ge, In, Mn, Al, In, Sb, Si, Sn, Ni, Pd, Ru, or V;
the second material comprises one or more of Pt, Pd, Ir, Ru, or Ni; and
wherein the first material has a thickness in a range of 0.6 nm to 2 nm, and wherein the second material has a thickness in a range of 0.1 nm to 3 nm.

5. The apparatus of claim 1, wherein the second structure comprises the dielectric, which comprises Mg and O.

6. The apparatus of claim 1, wherein the first structure or the third structure comprises a super lattice comprising a first material and a second material, wherein the first material comprises one or more of Co, Ni, Fe, or a Heusler alloy, and wherein the second material comprises one or more of Pt, Pd, Ir, Ru, or Ni.

7. The apparatus of claim 1, wherein the first structure comprises a stack of three materials comprising a first material adjacent to the fourth structure, a second material adjacent to the first material but not in contact with the fourth structure, and a third material adjacent to the second material and the second structure, wherein the first material comprises one or more of: Co, Ni, Fe, or a Heusler alloy, wherein the second material comprises Ru; and wherein the third material comprises one or more of Co, Ni, Fe, or a Heusler alloy.

8. The apparatus of claim 1, wherein the electrode comprises SHE material, the SHE material comprising one or more of β-Tantalum (β-Ta), Ta, β-Tungsten (β-W), W, Platinum (Pt), Copper (Cu) doped with elements comprising one or more of Iridium, Bismuth or elements of 3d, 4d, 5d and 4f, 5f periodic groups, Ti, S, W, Mo, Se, B, Sb, Re, La, C, P, La, As, Sc, O, Bi, Ga, Al, Y, In, Ce, Pr, Nd, F, Ir, Mn, Pd, or Fe.

9. The apparatus of claim 1, wherein the electrode comprises SOT material, the SOT material comprising one or more of a 2D material or a 3D material.

10. The apparatus of claim 1, wherein the magnetic junction is one of a spin valve or a magnetic tunneling junction (MTJ).

11. The apparatus of claim 1, wherein the magnet of the first structure is a paramagnet comprising one or more of Pt, Pd, W, Ce, Al, Li, Mg, Na, Cr, Co, Dy, O, Er, Eu, Eu, Gd, Fe, Nd, K, Pr, Sm, Tb, Tm, or V, or wherein the magnet of the first structure is a paramagnet comprising dopants comprising one or more of Ce, Cr, Mn, Nb, Mo, Tc, Re, Nd, Gd, Tb, Dy, Ho, Er, Tm, or Yb.

12. A system, comprising:
a memory;
processor circuitry coupled to the memory, the processor circuitry comprising a magnetic memory, the magnetic memory comprising:
a magnetic junction comprising a stack of structures comprising:
a first structure comprising a magnet with unfixed perpendicular magnetic anisotropy (PMA) relative to an x-y plane of the apparatus;
a second structure comprising one of a dielectric or a metal; and
a third structure comprising a magnet with fixed PMA, wherein the third structure has an anisotropy axis perpendicular to the x-y plane of the apparatus, and wherein the third structure is adjacent to the second structure such that the second structure is between the first and third structures;
a fourth structure adjacent to the first structure of the magnetic junction, wherein the fourth structure comprises one or more of Hf, Ta, W, Ir, Pt, Bi, Cu, Mo, Gd, Ge, Ga, or Au;
an electrode comprising a spin Hall effect (SHE) or spin orbit torque (SOT) material adjacent to the fourth structure such that the fourth structure is between the magnetic junction and the electrode, wherein the fourth structure is on the electrode, the electrode comprises a stack of layers, and one of the layers in the stack comprises an antiferromagnetic (AFM) material comprising a quasi-two-dimensional triangular AFM comprising $Ni_{(1-x)}M_xGa_2S_4$, where 'M' comprises one or more of Mn, Fe, Co or Zn; and
a wireless interface to allow the processor to communicate with another device.

13. The system of claim 12, wherein the electrode comprises SOT material, the SOT material comprising one or more of a 2D material or a 3D material.

14. An apparatus, comprising:
a magnetic junction comprising a first magnet with a first magnetization separated by a second magnet with a second magnetization by a barrier layer therebetween;
a first structure adjacent to the magnetic junction, wherein the first structure comprises one or more of Hf, Ta, W, Ir, Pt, Bi, Cu, Mo, Gd, Ge, Ga, or Au;
an electrode comprising a spin Hall effect (SHE) or spin orbit torque (SOT) material adjacent to the first structure such that the first structure is between the first magnet of the magnetic junction and the electrode, wherein the first structure is on the electrode and the electrode comprises an antiferromagnetic (AFM) material comprising a quasi-two-dimensional triangular AFM comprising $Ni_{(1-x)}M_xGa_2S_4$, where 'M' comprises one or more of Mn, Fe, Co or Zn.

15. The apparatus of claim 14, further comprising a second structure adjacent to the electrode such that the first and second structures are on opposite surfaces of the electrode, wherein the second structure comprises a magnet with in-plane magnetization relative to the x-y plane of the apparatus.

16. The apparatus of claim 14, wherein the magnetic junction comprises:
a second structure between the first magnet and the barrier layer or between the second magnet and the barrier layer, wherein the second structure comprises one or more of: Ru, Os, Hs, or Fe.

17. The apparatus of claim 14, wherein the barrier layer comprises Mg and O.

18. The apparatus of claim 14, wherein the first magnet or the second magnet comprises a super lattice comprising a first material and a second material, wherein the first material comprises one or more of Co, Ni, Fe, or a Heusler alloy, and wherein the second material comprises one or more of Pt, Pd, Ir, Ru, or Ni.

19. The apparatus of claim 14, wherein the magnetic junction is one of a spin valve or a magnetic tunneling junction (MTJ).

* * * * *